(12) United States Patent
Janisch et al.

(10) Patent No.: US 11,725,964 B2
(45) Date of Patent: Aug. 15, 2023

(54) POSITION SENSOR SYSTEM, PARTICULARLY FOR DETECTING ROTARY MOVEMENT AND METHOD FOR DETECTING ERRORS IN A POSITION SENSOR SYSTEM

(71) Applicant: Renesas Electronics America Inc., Milpitas, CA (US)

(72) Inventors: Josef Janisch, Ilz (AT); Marcin Augustyniak, Küsnacht (CH); Angel Karachomakov, Aytos (BG)

(73) Assignee: Renesas Electronics America Inc., Milpitas, CA (US)

( * ) Notice: Subject to any disclaimer, the term of this patent is extended or adjusted under 35 U.S.C. 154(b) by 644 days.

(21) Appl. No.: 16/794,005

(22) Filed: Feb. 18, 2020

(65) Prior Publication Data

US 2020/0264016 A1 Aug. 20, 2020

(30) Foreign Application Priority Data

Feb. 19, 2019 (EP) .................................. 19157954

(51) Int. Cl.
*G01D 5/244* (2006.01)
*G06F 11/14* (2006.01)
*H03M 1/12* (2006.01)

(52) U.S. Cl.
CPC ......... *G01D 5/24476* (2013.01); *G06F 11/14* (2013.01); *H03M 1/1205* (2013.01)

(58) Field of Classification Search
CPC .... G01D 5/24476; G01D 5/145; G01D 3/036; G06F 11/14; H03M 1/1205; G01B 7/003
See application file for complete search history.

(56) References Cited

U.S. PATENT DOCUMENTS

| | | | |
|---|---|---|---|
| 2015/0357980 A1 | 12/2015 | Funato et al. | |
| 2017/0234910 A1* | 8/2017 | Nakamura | G01R 19/0092 324/251 |
| 2018/0017413 A1* | 1/2018 | Walters | H02P 21/12 |
| 2018/0231396 A1* | 8/2018 | Mori | G01R 33/07 |

FOREIGN PATENT DOCUMENTS

WO 2006092026 A1 9/2006

* cited by examiner

*Primary Examiner* — David R Lazaro
*Assistant Examiner* — Zia Khurshid
(74) *Attorney, Agent, or Firm* — Haynes and Boone, LLP

(57) ABSTRACT

A rotary movement position sensor is presented that includes a first sensor output, a second sensor output, a first signal processing unit, a second signal processing unit, a first system output providing the output of the first signal processing unit or of the second signal processing unit, and a second system output providing the output of the second signal processing unit or of the first signal processing unit. A swapping unit that swaps the first signal processing unit between the first sensor output and first system output to the second sensor output and second system output and simultaneously swaps the second signal processing unit from the second sensor output and second system output to the first sensor output and first system output and vice versa. A method for detecting errors in a position sensor system is also presented.

15 Claims, 16 Drawing Sheets

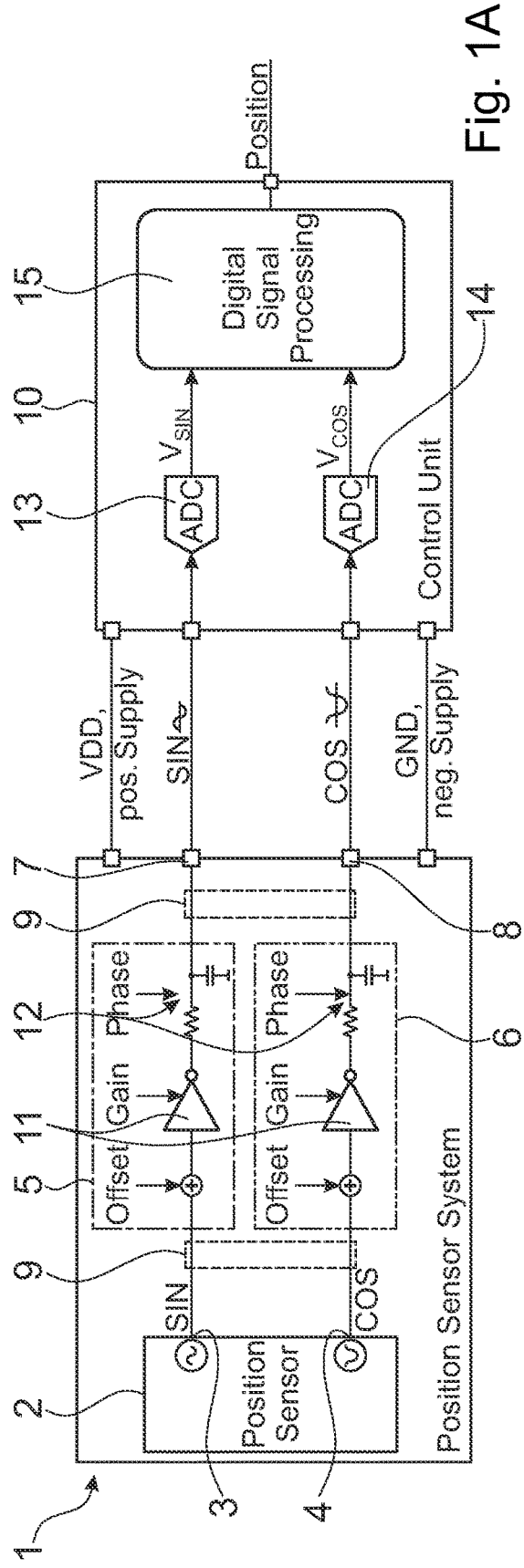 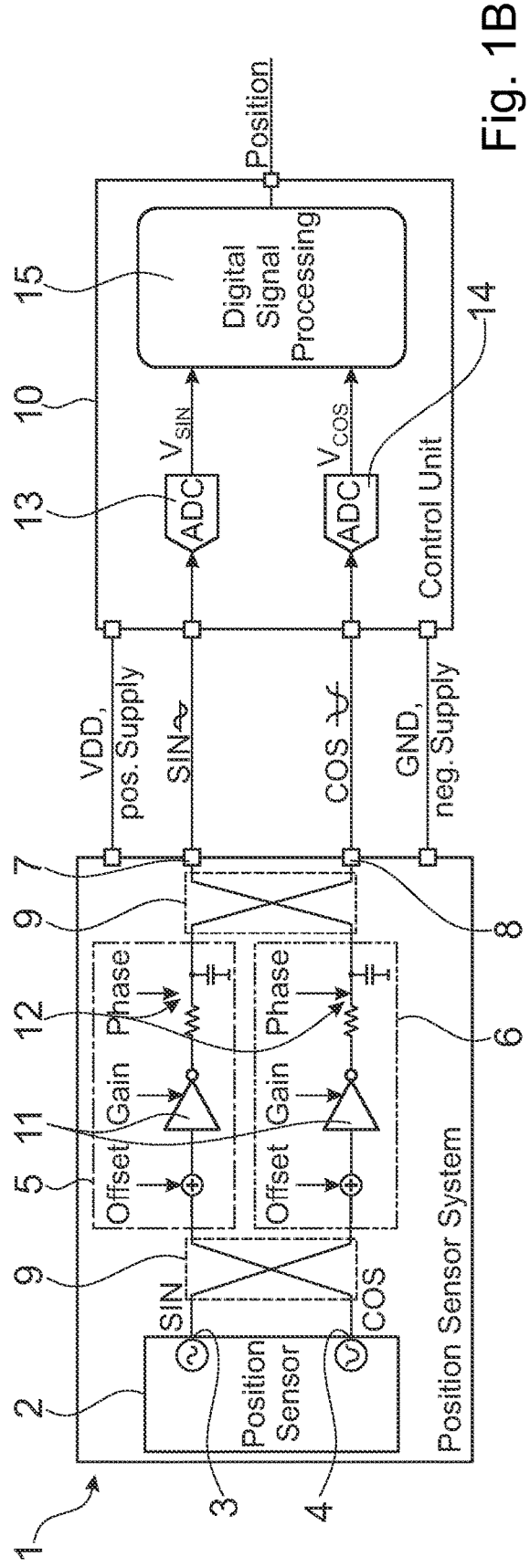
Fig. 1A
Fig. 1B

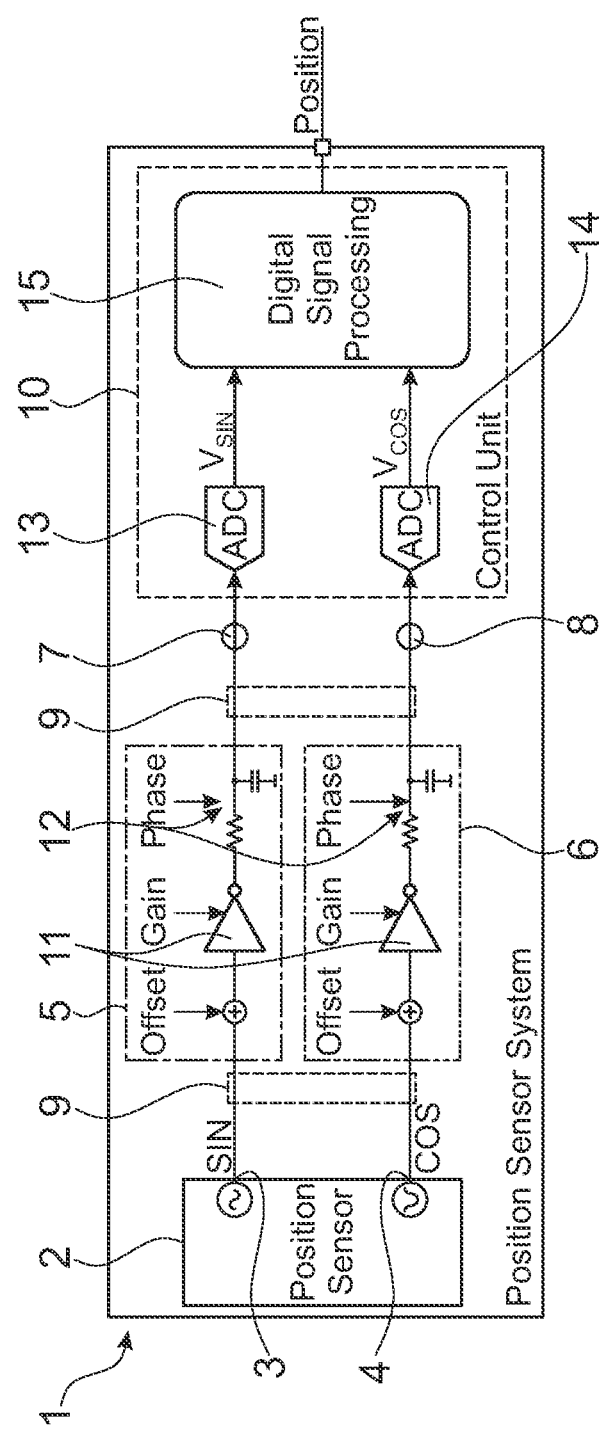

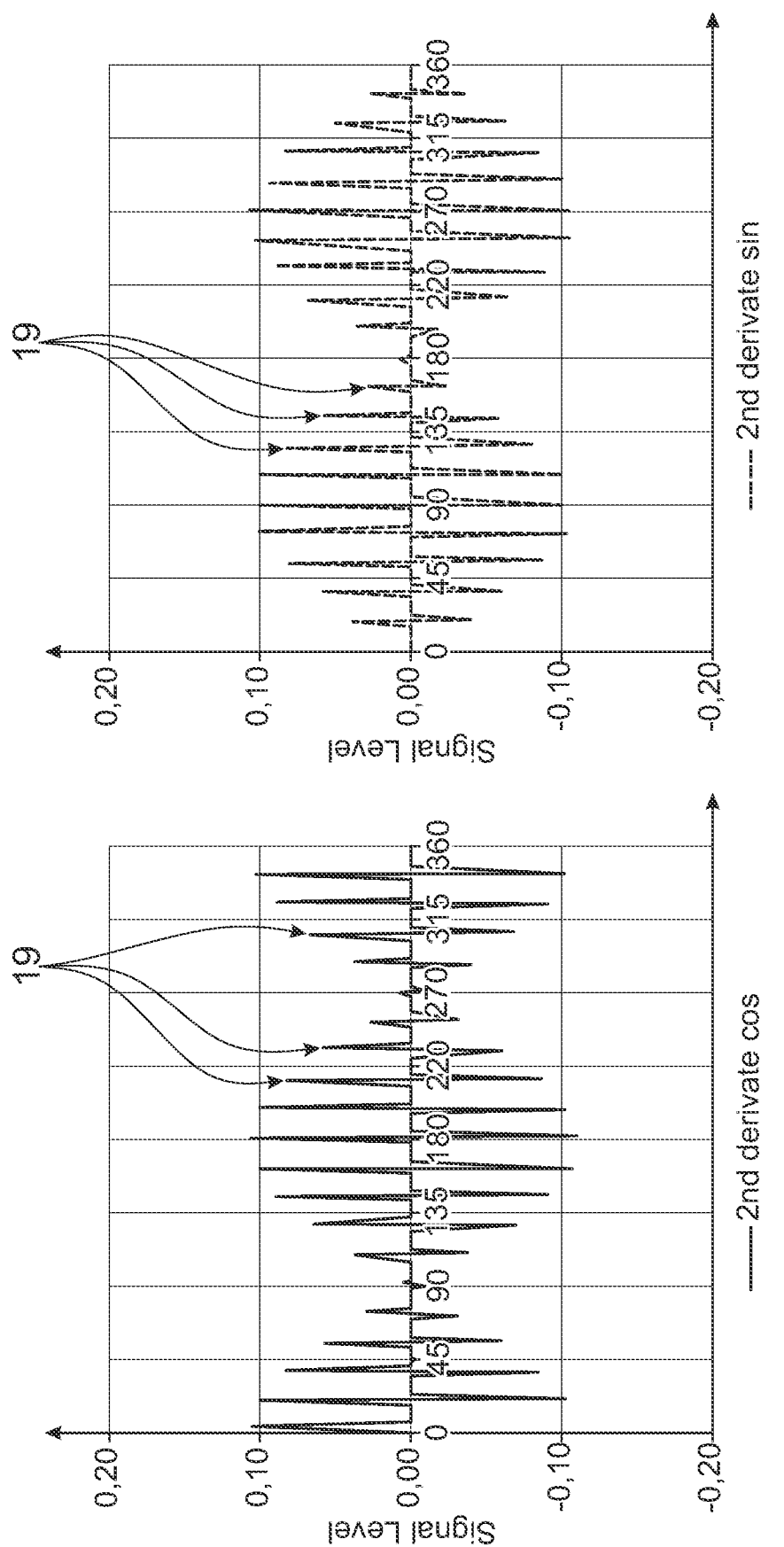

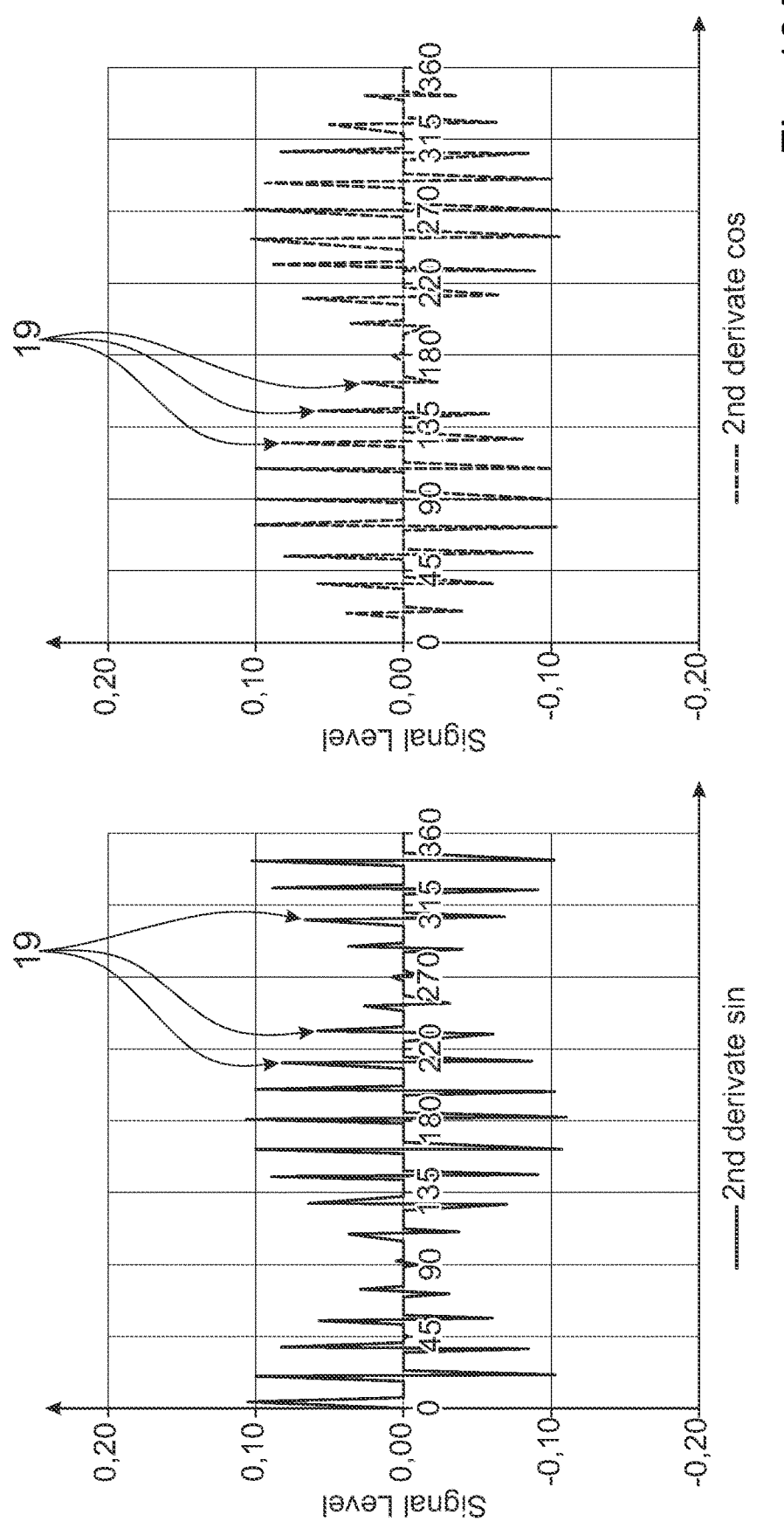

POSITION SENSOR SYSTEM, PARTICULARLY FOR DETECTING ROTARY MOVEMENT AND METHOD FOR DETECTING ERRORS IN A POSITION SENSOR SYSTEM

RELATED APPLICATIONS

The present application claims priority to European Patent Application No. 19157954.9, entitled "Position sensor system, particularly for detecting rotary movement and method for detecting errors in a position sensor system," filed on 19 Feb. 2019, incorporated herein by reference in its entirety.

TECHNICAL FIELD

Embodiments of the invention relate to a position sensor system, particularly for detecting rotary movement. The invention further relates to a method for detecting errors in a position sensor system, particularly for detecting rotary movement.

BACKGROUND

A position sensor system, particularly for detecting rotary movements, includes a position sensor, particularly for detecting rotary movements of the item being measured. The item to be measured is for example a rotor in an electric motor.

The position sensor provides the raw sensor data in the form of a sinusoidal signal, where one period of the sensor signal represents a full turn or fractions of a full turn of the item being measured.

SUMMARY

In order to improve the signal quality and to allow unambiguous position calculation over a full phase, a second sensor signal is introduced, which is again sinusoidal, but phase shifted by a quarter of a phase or 90 electrical degrees. Typically, the first sensor signal is designated as Sine-signal and the second sensor signal is designated as Cosine-signal.

The first sensor signal is provided by a first sensor output and the second sensor signal is provided by a second sensor output.

The position sensor system further comprises at least one signal processing unit, for processing the Sine-signal and Cosine-signal of the position sensor. Typically, the sensor signals are amplified and filtered by the signal processing unit. In practice, such a signal path of the position sensor system may contain errors, which can be categorized into offset errors, gain mismatch errors and phase errors.

Offset errors refer to a shifting of one or both of the sensor signals in the voltage domain to either positive or negative direction. Gain mismatch errors refer to different gains of the Sine-signal path and the Cosine-signal path and phase errors refer to a phase shift between the two sensor signals that is lower or higher than the nominal 90°.

The output of the at least one signal processing unit, which corresponds to the output of the position sensor system, is afterwards processed by an electronic control unit, which for example comprises an analog-to-digital converter and a digital signal processing unit. The electronic control unit can be internal or external of the position sensor system.

According to a variant of the prior art the signal processing unit comprises a multiplexer at the input of the signal processing unit. A block diagram of such a position sensor system is shown in FIG. 11. The Sine-signal and the Cosine-signal of the position sensor are sequentially processed, i.e. amplified and filtered, by the signal processing unit and passed to the electronic control unit. The electronic control unit provides a control signal to the multiplexer of the signal processing unit in order to distinguish which signal is being selected by the multiplexer. The advantage of this variant is, that both position sensor signals, i.e. Sine-signal and Cosine-signal, are processed (amplified and filtered) by the same signal processing unit. Thus, there is no gain mismatch as both are processed by the same signal processing unit, i.e. the same amplifier. Likewise, any parasitic phase shift aside from the intrinsic 90° phase shift between Sine-signal and Cosine-signal introduced by the signal processing unit will be the same for both position sensor signals. Offset errors are not cancelled by this variant, however both signals will have the same additional offset (if any) introduced by the signal processing unit. Another advantage of this variant is that the signal processing unit is only required once for both signals. A disadvantage of this variant is that in a rotating position sensor system, due to the sequential processing of both signals, both position sensor signals are not measured at the same position as the item to be measured will have moved by a certain amount between the measurements of the two position sensor signals, which is particularly disadvantageous for high speed systems, as this error increases with rotating speed. A further disadvantage of this variant is the required feedback from the electronic control unit to the multiplexer of the signal processing unit, requiring additional signal wires, which is the reason that this variant is typically used for position sensor systems where the electronic control unit is on the same chip as the position sensor system.

Pursuant to another variant of the prior art the Sine-signal and Cosine-signal of the position sensor are processed in parallel by two signal processing units, i.e. each position sensor signal is amplified and filtered by a separate signal processing unit. This provides the fastest possible signal processing, but it requires two signal processing units, i.e. two amplifiers and two filters. There will always be some residual gain, offset and/or phase mismatch between these amplifiers. Since the position sensor signals are processed in parallel the position sensor system has two outputs, each corresponding to the output of one signal processing unit.

The electronic control unit can process the two position sensor outputs in parallel by two analog-to-digital converters, which forward the digital signals to a common digital signal processing unit. However, there will be non-linearity differences in the two analog-to-digital converters.

Alternatively, the two position sensor system outputs can be processed by a control unit having a multiplexed analog-to-digital converter. The multiplexer is part of the control unit, which has full control of the multiplexer and is typically on the same chip. The limiting factor of this variant is the processing speed of the control unit, especially of the analog-to-digital converter. This variant poses the same issues with offset, gain and phase mismatch of the two signal processing units of the position sensor system, but eliminates non-linearity differences due to using only one analog-to-digital converter.

It is an object of the present invention to detect any gain, offset and phase mismatch of a position sensor system comprising two signal processing units for processing the Sine-signal and Cosine-signal of a position sensor in parallel, especially for high speed position sensor systems.

This object is solved according to embodiments of the invention by a position sensor system, particularly for detecting rotary movement, comprising:

a position sensor, particularly for detecting rotary movement, with a first sensor output and a second sensor output, a first signal processing unit for processing, particularly amplifying and filtering, the signal of the first sensor output or the second sensor output, a second signal processing unit for processing, particularly amplifying and filtering, the signal of the second sensor output or the first sensor output, a first system output providing the output of the first signal processing unit or of the second signal processing unit, and a second system output providing the output of the second signal processing unit or of the first signal processing unit, which is characterized in that the position sensor system further comprises a swapping unit for swapping the first signal processing unit from the first sensor output and first system output to the second sensor output and second system output and for simultaneously swapping the second signal processing unit from the second sensor output and second system output to the first sensor output and first system output and vice versa.

The position sensor system according to some embodiments of the invention has a first operating condition, in which the first sensor output is connected to the first signal processing unit and the output of the first signal processing unit is connected to the first system output and in which the second sensor output is connected to the second signal processing unit and the output of the second signal processing unit is connected to the second system output. The swapping unit for swapping the first signal processing unit from the first sensor output and first system output to the second sensor output and second system output and for simultaneously swapping the second signal processing unit from the second sensor output and second system output to the first sensor output and first system output transfers the position sensor system to a second operating condition. In the second operating condition the first sensor output is connected to the second signal processing unit and the output of the second signal processing unit is connected to the first system output and in the second sensor output is connected to the first signal processing unit and the output of the first signal processing unit is connected to the second system output. Thus, the swapping unit transfers the position sensor system from a first operating condition to a second operating condition and back to the first operating condition and so on.

By swapping the first signal processing unit and the second signal processing unit between the first sensor out and first system output and the second sensor output and second system output the position sensor signals are processed alternatingly by the first signal processing unit and the second signal processing unit. By detecting any differences between the processing by the first signal processing unit and the processing by the second signal processing unit, it is possible to detect any gain, offset and phase mismatch of the position sensor system. Any mismatch between the first signal processing unit and second processing unit is measurable as a ripple on the outputs of the first signal processing unit and second processing unit. Furthermore, the position sensor system allows fast error detection at slow rotating speeds or at static positions of the position sensor.

Additionally, by averaging the swapped and un-swapped signals, i.e. the signals for a specific position sensor output processed by the first signal processing unit and the signals processed by the second processing unit, a gain mismatch can be compensated.

Preferably, the swapping unit swaps the first signal processing unit and second processing unit, i.e. between the first operating condition and the second operating condition, regularly, preferably in equal intervals.

In a preferred variant of the invention the first sensor output provides a sinusoidal signal and the second sensor output provides a sinusoidal signal, which is phase shifted by a quarter of one phase or 90 electrical degrees. Such a first sensor signal and second sensor signal are referred to as Sine-signal respectively Cosine-signal. However, the invention is not limited to sinusoidal sensor signals and/or phase shifts of a quarter of one phase or 90 electrical degrees.

Pursuant to some embodiments of the invention the first signal processing unit and the second signal processing unit each comprise an amplifier and a filter, for amplifying and filtering the first sensor output and second sensor output.

According to some embodiments of the invention the position sensor system further comprises a control unit for processing the first system output and the second system output. The control unit can be internal or external and especially on the same chip or a different chip as the position sensor system.

In accordance with some embodiments of the invention the control unit comprises a first analog-to-digital converter for the first system output, a second analog-to-digital converter for the second system output, and a digital signal processing unit for processing the signals of the first analog-to-digital converter and the second analog-to-digital converter. Thus, the signals of the first system output and the second system output are processed in parallel by the first analog-to-digital converter respectively the second analog-to-digital converter of the control unit. This provides the fastest possible signal processing but might add some non-linearity differences due to the two analog-to-digital converters.

In some embodiments of the invention the control unit comprises a multiplexer for multiplexing between the first system output and the second system output and a common analog-to-digital converter connected to the output of the multiplexer, and a digital signal processing unit for processing the signal of the common analog-to-digital converter. This variant is limited by the processing speed of the analog-to-digital converter. Since the multiplexer and the control unit controlling the multiplexer are typically on the same chip, this is not excessively limiting the processing speed. Since only one analog-to-digital converter is used in this variant, the possible non-linearity differences due to the two analog-to-digital converters are avoided.

In either alternative the digital signal processing unit usually does not limit the processing speed due to the current processing speeds and available multi-core processors.

The control unit is particularly designed to detect ripples in the first system output and/or second system output caused by swapping the first signal processing unit and the second signal processing unit, i.e. caused by alternating between the first operating condition and the second operating condition. If there is any gain, offset and/or phase mismatch the first system output and the second system output will change simultaneously with the swapping of the signal processing units. This change in the first system output and second system output is referred to as ripple, which is detected by the control unit. If the swapping occurs in regular intervals, the ripple will also change in these intervals.

According to some embodiments of the invention the position sensor is mounted on a non-moving part of the item to be measured.

Pursuant to some embodiments of the invention, the control unit further determines the magnitude of the ripples in the first system output and or second system output. This helps to measure and distinguish any offset errors, gain mismatch errors and phase errors.

According to some embodiments of the invention the control unit determines the 2nd derivate of the first system output and of the second system output and detects peaks in the calculated 2nd derivates representing errors in the first signal processing unit respectively in the second signal processing unit. Ripple determination is negatively influenced by signal noise in the first signal processing unit, in the second signal processing unit and/or in case the item to be measured is rotating during ripple determination. Improved results can be achieved by determining the 2nd derivative of the first system output and the second system output, representing their respective acceleration. Since the rate of change in a swapping step, i.e. switching between the first operating condition and the second operating condition, is significantly faster than a typical rotational movement of the item to be measured these cases can be easily distinguished. Likewise, the swapping step can be easily distinguished from the noise typically occurring in analog signal processing.

In some embodiments of the invention the control unit calculates the average of the first system output respectively of the second system output. By determining the average of the system output signals, any gain mismatch errors between the two signal processing units can be compensated. Further, by determining the average any phase errors can be reduced to a constant level over a full signal period and any offset errors can be reduced.

Preferably, the position sensor is a magnetic sensor, an inductive sensor or an eddy current sensor, particularly a Hall sensor, an anisotropic magneto resistance sensor, a tunneling magneto resistance sensor or a giant magneto resistance sensor.

The position sensor system can comprise more than one position sensor. Preferably the position sensor system comprises two separate signal processing units and a corresponding swapping unit for each position sensor. By providing more than one, further preferred at least three, position sensors, that data of the position sensors can be compared to each other, to detect errors in the data of the position sensors. By having more than two position sensors it is easier to detect the position sensor which provides signals with errors.

The object is further solved according to some embodiments of the invention by a method for detecting errors in a position sensor system, particularly for detecting rotary movement, comprising:
  a first operating condition, in which a first sensor output is processed by a first signal processing unit and provided to a first system output and in which a second sensor output is processed by a second signal processing unit and provided to a second system output, and
  a second operating condition, in which the first sensor output is processed by the second signal processing unit and provided to the first system output and in which the second sensor output is processed by the first signal processing unit and provided to the second system output, and further comprising the step of alternating between the first operating condition and the second operating condition.

In the first operating condition of the position sensor the first sensor signal is processed by the first signal processing unit and provided to the first system output and the second system sensor output is processed by the second signal processing unit and provided to the second system output. By swapping the signal processing units, the position sensor system is in the second operating state, in which the first sensor output is processed by the second signal processing unit and provided to the first system output and in which the second sensor output is processed by the first signal processing unit and provided to the second system output. According to inventive method the first and second operating states alternate.

By detecting any differences between the processing by the first signal processing unit and the processing by the second signal processing unit, it is possible to detect any gain, offset and phase mismatch. Any mismatch between the first signal processing unit and second processing unit is measurable as a ripple on the outputs of the first signal processing unit and second processing unit. Furthermore, the position sensor system allows fast error detection at slow rotating speeds or at static positions of the position sensor.

In some embodiments of the invention the first sensor output provides a sinusoidal signal and the second sensor output provides a sinusoidal signal, which is phase shifted by a quarter of one phase or 90 electrical degrees. Such a first sensor signal and second sensor signal are referred to as Sine-signal respectively Cosine-signal. However, the invention is not limited to sinusoidal sensor signals and/or phase shifts of a quarter of one phase or 90 electrical degrees.

Pursuant some embodiments of the invention the first signal processing unit and the second signal processing unit each amplify and filter the first sensor output or second sensor out, depending on the current operating state. Therefore, the first signal processing unit and the second signal processing unit each comprise an amplifier and a filter.

According to some embodiments of the invention the first system output and the second system output are processed by a control unit. The control unit can be internal or external and especially on the same chip or a different chip as the position sensor system.

In some embodiments of the invention the first system output is converted by a first analog-to-digital converter and the second system output is converted by a second analog-to-digital converter of the control unit. Thus, the signals of the first system output and the second system output are processed in parallel by the first analog-to-digital converter respectively the second analog-to-digital converter of the control unit. This provides the fastest possible signal processing but might add some non-linearity differences due to the two analog-to-digital converters.

Alternatively, the control unit multiplexes between the first system output and the second system output and converts the multiplexed signal by a common analog-to-digital converter. This variant is limited by the processing speed of the analog-to-digital converter. Since the multiplexer and the control unit controlling the multiplexer are typically on the same chip, this is not excessively limiting the processing speed. Since only one analog-to-digital converter is used in this variant, the possible non-linearity differences due to the two analog-to-digital converters are avoided.

Advantageously, the signals of the first analog-to-digital converter and of the second analog-to-digital converter or of the common analog-to-digital converter are processed by a digital signal processing unit. The digital signal processing unit usually does not limit the processing speed due to the current processing speeds and available multi-core processors.

Pursuant to some embodiments of the invention the method comprises the step of determining the ripples in the first system output and/or second system output overtime for a static position sensor and/or over the position of the sensor.

In some embodiments of the invention the method comprises the step of determining the magnitude for the ripples in the first system output and second system output. This helps to measure and distinguish any offset errors, gain mismatch errors and phase errors.

According to some embodiments of the invention the method comprises the step of calculating the 2nd derivate of the first system output and of the second system output and detecting peaks in the calculated 2nd derivates representing errors in the first signal processing unit respectively in the second signal processing unit. Improved results can be achieved by determining the 2nd derivate of the first system output and the second system output, representing their respective acceleration. Since the rate of change in a swapping step, i.e. switching between the first operating condition and the second operating condition, is significantly faster than a typical rotational movement of the item to be measured these cases can be easily distinguished. Likewise, the swapping step can be easily distinguished from the noise typically occurring in analog signal processing.

In accordance with some embodiments of the invention the method comprises the step of determining the average of the first system output and of the second system output. By determining the average of the system output signals, any gain mismatch errors between the two signal processing units can be compensated. Further, by determining the average any phase errors can be reduced to a constant level over a full signal period and any offset errors can be reduced.

Preferably, step of alternating between the first operating condition and the second operating condition is executed regularly, preferably in equal intervals.

BRIEF DESCRIPTION OF THE DRAWINGS

In the following, the invention will be further explained with respect to the embodiments shown in the figures. It shows:

FIG. 1A illustrates a block diagram of a position sensor system according to a first embodiment of the invention in a first operating condition, FIG. 1B illustrates a block diagram of the position sensor system of FIG. 1A in a second operating condition, FIG. 3 illustrates a block diagram of a position sensor system according to a third embodiment of the invention in a first operating condition, FIG. 9A illustrates a diagram showing the second derivate for output signals of a position sensor system with an amplitude error over position, FIG. 10A illustrates a diagram showing the second derivate for output signals of a position sensor system with a phase error over position.

DETAILED DESCRIPTION

Figure 2A:
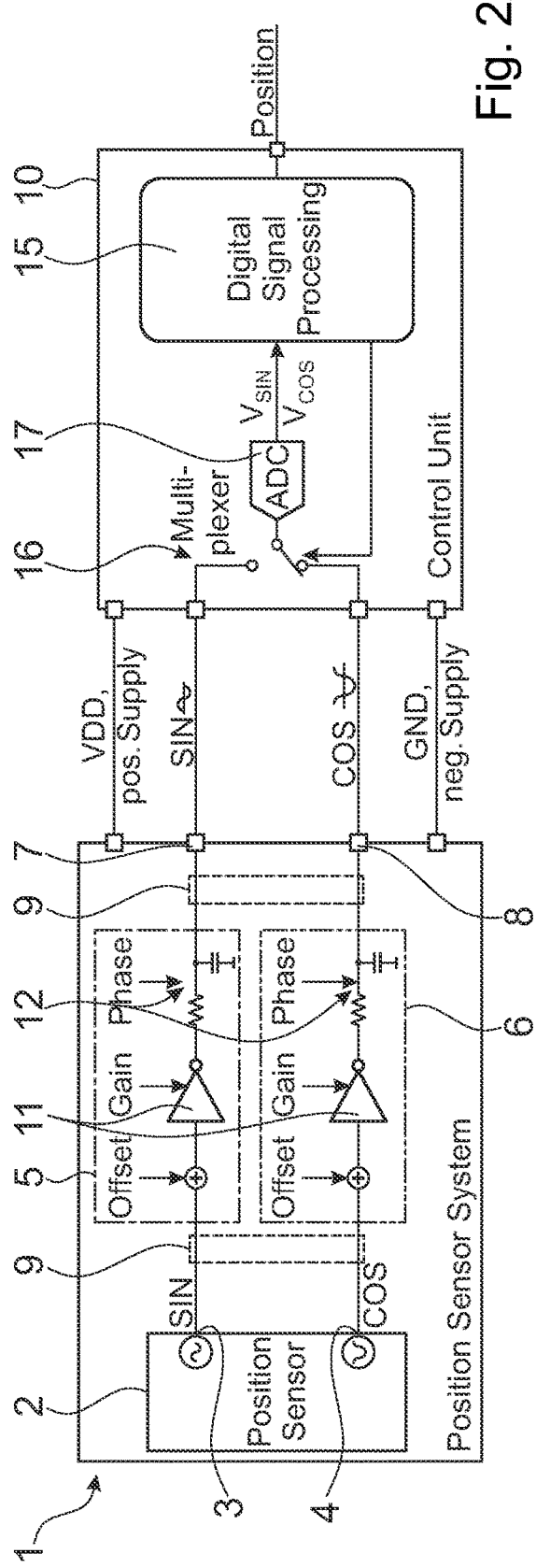
FIG. 2A illustrates a block diagram of a position sensor system according to a second embodiment of the invention in a first operating condition.

FIG. 1A shows a block diagram of a first embodiment of a position sensor system 1, particularly for detecting rotary movement, in a first operating condition. The position sensor system 1 comprises a position sensor 2, particularly for detecting rotary movement, with a first sensor output 3 and a second sensor output 4. The position sensor system 1 further comprises a first signal processing unit 5 for processing, particularly amplifying and filtering, the signal of the first sensor output 3 or the second sensor output 4, and a second signal processing unit 6 for processing, particularly amplifying and filtering, the signal of the second sensor output 4 or the first sensor output 3.

The signal of the first sensor output 3 and the second sensor output 4 are either processed by the first signal processing unit 5 or the second signal processing unit 6 at a time. Thus, if the first sensor output 3 is processed by the first signal processing unit 5 the second sensor output 4 is processed by the second signal processing unit 6 and if the first sensor output is processed by the second signal processing unit 6 the second sensor output 4 is processed by the first signal processing unit 5.

The position sensor system 1 further comprises a first system output 7 providing the output of the first signal processing unit 5 or of the second signal processing unit 6 and a second system output 8 providing the output of the second signal processing unit 6 or of the first signal processing unit 5. Again, at a given time the output of the first signal processing unit 5 is provided by either the first system output 7 or the second system output 8 and the output of the second signal processing unit 6 is provided at that time by the other of the second system output 8 or the first system output 7. Thus, if the output of the first signal processing unit 5 is provided by the first system output 7 the output of the second signal processing unit 6 is provided by the second system output 8 and if the output of the first signal processing unit 5 is provided by the second system output 8 the output of the second signal processing unit 6 is provided by the first system output 7.

According to the invention the position sensor system 1 further comprises a swapping unit 9 for swapping the first signal processing unit 5 from the first sensor output 3 and the first system output 7 to the second sensor output 4 and second system output 8 and for simultaneously swapping the second signal processing unit 6 from the second sensor output 4 and second system output 8 to the first sensor output 3 and first system output 7 and vice versa. In FIG. 1A the swapping unit 9 is identified by two dashed circles, one between the position sensor 2 and the signal processing units 5, 6 and the other between the signal processing units 5, 6 and the system outputs 7, 8, i.e. at the two locations where the swapping takes place.

In the first operating condition of FIG. 1A the first sensor output 3 is connected to the first signal processing unit 5 and the output of the first signal processing unit 5 is connected to the first system output 7. Consequently, the second sensor output 4 is connected to the second signal processing unit 6 and the output of the second signal processing unit 6 is connected to the second system output 8.

The first signal processing unit 5 and the second signal processing unit 6 each comprise an amplifier 11 and a filter 12. The amplifier 12 is for example an operation amplifier (op-amp) and the filter 12 is for example a resistor-capacitor circuit (RC circuit). The first signal processing unit 5 and/or the second signal processing unit 6 can add some offset error, gain error and/or phase error, as indicated in FIG. 1A by the corresponding arrows.

The position sensor system 1 of FIG. 1A further comprises a control unit 10. The control unit 10 can be either integral with the position sensor system 1, i.e. on the same chip, or external of the position sensor system 1 and connected to the position sensor system 1 by e.g. a cable. FIG. 1A refers to an external control unit 10, as indicated by the connection points and lines between the position sensor system 1 and the control unit 10.

The control unit 10 in FIG. 1A comprises a first analog-to-digital converter 13 for the first system output 7 and a second analog-to-digital converter 14 for the second system output 8. The output of the first analog-to-digital converter 13 and of the second analog-to-digital converter 14 are processed by the same digital signal processing unit 15.

The control unit 10, especially the digital signal processing unit 15, is designed to detect ripples 18 in the first system output 7 and/or second system output 8, caused by swapping the first signal processing unit 5 and the second signal processing unit 6.

Furthermore, the control unit 10, especially the digital signal processing unit 15, is designed to determine the magnitude for the ripples 18 in the first system output 7 and second system output 8.

To further increase the accuracy of the position sensor system 1 the control unit 10, especially the digital signal processing unit 15, can determine the $2^{nd}$ derivate of the first system output 7 and of the second system output 8 and detect peaks in the $2^{nd}$ derivates. The peaks represent errors in the first signal processing unit 5 respectively in the second signal processing unit 6, especially offset, gain and/or phase errors.

To reduce or compensate errors in the first signal processing unit 5 and/or second signal processing unit 6 the control unit 10, especially the digital signal processing unit 15, can calculate the average of the first system output 7 respectively the second system output 8.

FIG. 1B shows a block diagram of the position sensor system 1 of FIG. 1A in a second operating condition. In this second operating condition the first sensor output 3 is connected to the second signal processing unit 6 and the second signal processing unit 6 is connected to the first system output 5. Further, the second sensor output 4 is connected to the first signal processing unit 5 and the first signal processing unit 5 is connected to the second system output 8. Thus, the swapping unit 9 has swapped the first signal processing unit 5 from the first sensor output 3 and first system output 7 to the second sensor output 4 and second system output 8 and simultaneously swapped the second signal processing unit 6 from the second sensor output 4 and second system output 8 to the first sensor output 3 and first system output 7. By swapping the signal processing units 5, 6 the swapping unit 9 changes the operating condition of the position sensor system 1.

Since the sensor output 3, 4 are processed by different signal processing units 5, 6 in the two operating conditions and because the different signal processing units 5, 6 may have different offset, gain and/or phase errors, the system outputs 7, 8 may contain ripples 18, which are detected by the control unit 10.

In FIG. 1B the swapping unit 9 is again identified by two dashed circles. The swapping of the signal processing units 5, 6 is identified by the crossings in the two dashed circles.

In the first operating condition shown in FIG. 1A the first sensor output 3 is processed by the first signal processing unit 5 and provided to the first system output 7 and the second sensor output 4 is processed by the second signal processing unit 6 and provided to the second system output 8.

In the second operating condition shown in FIG. 1B the first sensor output 3 is processed by the second signal processing unit 6 and provided to the first system output 7 and the second sensor output 4 is processed by the first signal processing unit 5 and provided to the second system output 8.

The swapping unit 8 causes an alternation between the first operating condition and the second operating condition.

The first signal processing unit 5 and the second processing unit 6 amplify and filter the first sensor output 3 and the second output 4 and thereby eventually adding offset errors, gain errors and/or phase errors.

The first system output 7 and the second system output 8 are processed by the control unit 10. The first system output 7 is converted by the first analog-to-digital converter 13 of the control unit 10 and the second system output 8 is converted by the second analog-to-digital converter 14 of the control unit 10. The signals of the first analog-to-digital converter 10 and of the second analog-to-digital converter 14 are processed by the digital signal processing unit 15 of the control unit 10.

The control unit 10 detects ripples 18 in the first system output 7 and/or the second system output 8, which are caused by alternating between the first operating condition and the second operating condition, i.e. by processing the sensor output signals 3, 4 by different signal processing nits 5, 6 in the two operating conditions.

By determining the magnitude for the ripples 18 in the first system output 7 and the second system output 8 the control unit 8 can determine the kind of error, i.e. offset error, gain error and/or phase error.

The accuracy of the error detection can be enhanced by calculating the $2^{nd}$ derivate of the first system output 7 and of the second system output 8 and detecting peaks in the calculated $2^{nd}$ derivates. The peaks represent errors in the first signal processing unit 5 respectively in the second signal processing unit 6.

By determining the average of the first system output 7 and of the second system output 8 the errors can be reduced or even compensated.

Advantageously, the swapping unit 9 swaps the first signal processing unit 5 and second signal processing unit 6 regularly, preferably in equal intervals.

Figure 2B:
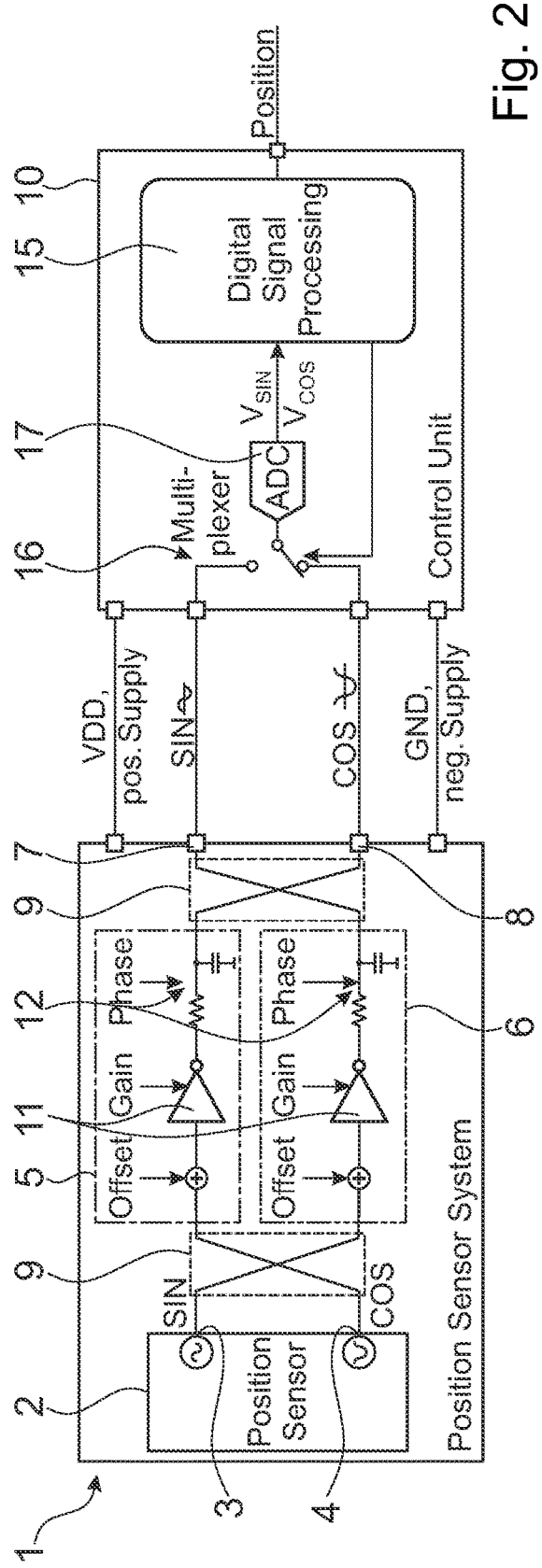
FIG. 2B illustrates a block diagram of the position sensor system of FIG. 2A in a second operating condition.

FIGS. 2A and 2B show a block diagram of a position sensor system 1 according to a second embodiment of the invention in a first operating condition respectively in a second operating condition. The second embodiment of the position sensor system 1 shown in FIGS. 2A and 2B differs from the first embodiment of the position sensor system 1 shown in FIGS. 1A and 1B in that the control unit 10 only comprises a common analog-to digital converter 17 instead of a first analog-to-digital converter 13 and a second analog-to-digital converter 18. In order to process the first system output 7 and the second system output 8, the control unit 10 comprises a multiplexer 16 for multiplexing between the first system output 7 and the second system output 8. The multiplexer 16 is preferably by the control unit 10 and a corresponding information is used by the digital signaling processing unit 15, so that the digital signal processing unit 15 can assign the current received digital signals from the common analog-to-digital converter 17 to the first system output 7 respectively second system output 8.

FIG. 3 shows a third embodiment of a position sensor system 1 according to the invention in a first operating condition. The third embodiment of FIG. 3 differs from the first embodiment of FIGS. 1A and 1B in that the control unit 10 is an internal control unit 10. Thus, the first system output 7 and the second system output 8 are internal to the position sensor system 1.

Since all other features correspond to the first embodiment of FIGS. 1A and 1B the third embodiment is not shown in the second operating condition. Furthermore, the internal control unit 15 can also be used for the second embodiment shown in FIGS. 2A and 2B accordingly.

Figure 4:
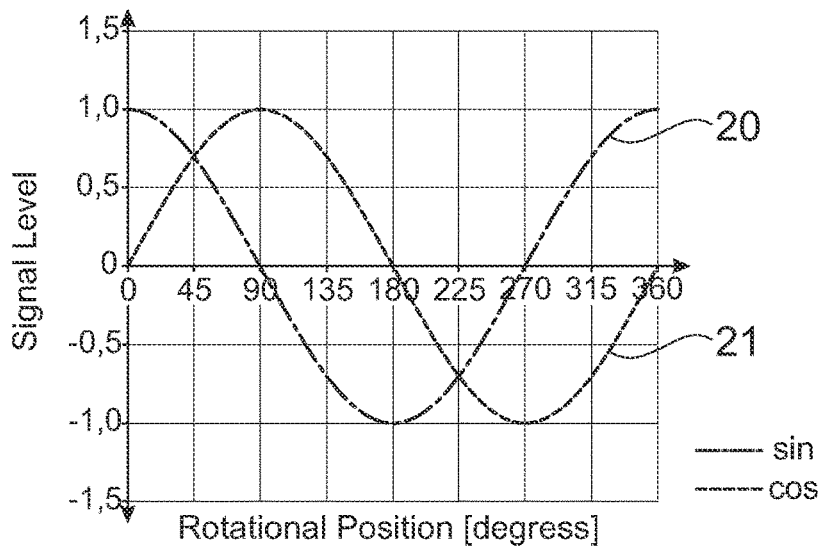
FIG. 4 illustrates a diagram showing output signals of a swapped position sensor system without error in the signal path.

FIG. 4 shows exemplary outputs of the first sensor output 3 and the second sensor output 4 in an error-free situation with no offset, ideal amplitude matching and ideal 90° phase shift between Sine-signal 20 and Cosine-signal 21, resulting in no swapping ripple. The horizontal axis of FIG. 4 represents the mechanical rotation, in this case 360° and the vertical axis represents the signal level of the first sensor output 3 and the second sensor output 4. In this case the maximum signal level is 1.0.

The first sensor output 3 provides a sinusoidal signal, which starts with a signal level of 0 at 0°. The sinusoidal signal of the first sensor output 3 is referred to as Sine-signal 20. The second sensor output 4 also provides a sinusoidal signal, which is phase shifted by a quarter of a phase respectively 90°. Thus, the signal level of the second sensor output 4 is 1.0 at 0°. The sinusoidal signal of the second sensor output is referred to as Cosine-signal 21.

The first sensor output is defined by:

$$A^* \sin\left(\frac{x * \pi}{180}\right) \text{ [}x \text{ in degree],}$$

or $A^* \sin(x)$ [$x$ in radians], and the second sensor output is defined by:

$$A^* \sin\left(\frac{(x+90) * \pi}{180}\right) \text{ or } A^* \cos\left(\frac{(x) * \pi}{180}\right) \text{ [}x \text{ in degree], or}$$

$$A^* \sin\left(x + \frac{\pi}{2}\right) \text{ or } A^* \cos(x) \text{ [}x \text{ in radians].}$$

The peak amplitude respectively the signal level A is 1.0 in FIG. 4.

Figure 5A:
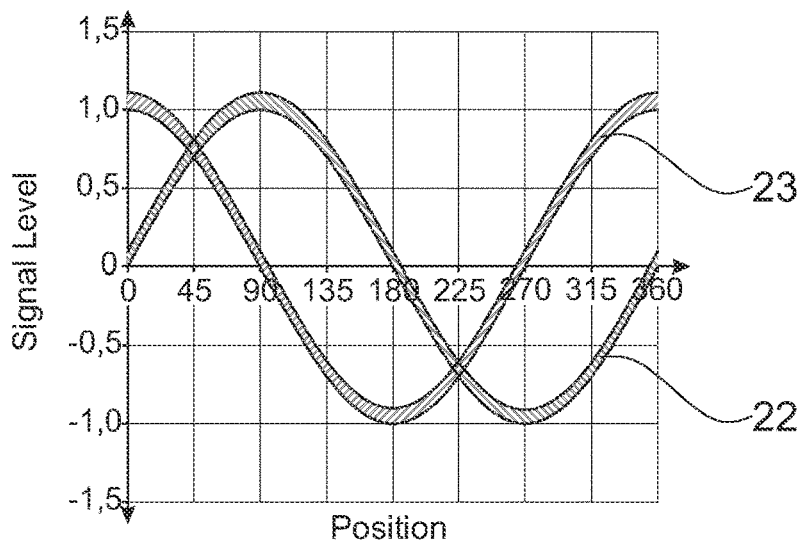
FIG. 5A illustrates a diagram showing output signals of a swapped position sensor system with an offset error.

FIG. 5A shows an error case where the second signal processing unit 6 has an offset error of 10% relative to the maximum signal amplitude of 1.0. FIG. 5A shows the Sine-signal 22 and Cosine-signal 23 of the first system output 7 respectively the second system output 8 with the offset error over a full phase (0° to 360°).

Figure 5B:
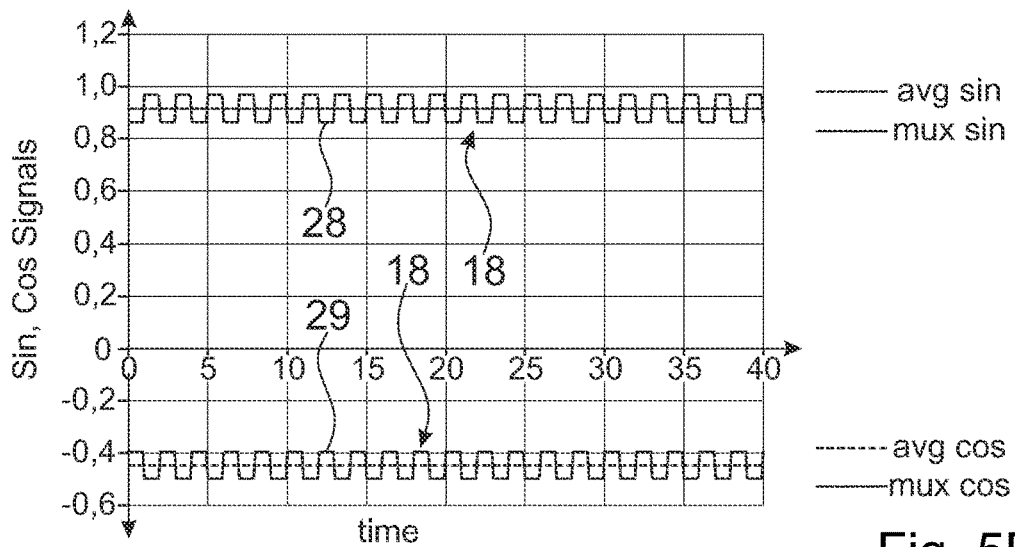
FIG. 5B illustrates a diagram showing an output of a static position sensor with the offset error of FIG. 5A over time.

FIG. 5B shows the output of a static sensor located at 120° of FIG. 5A in the time domain. The horizontal time axis is a relative number, representing 40 swapping cycles (20 swapping periods). The deviation between the signals of the two operating conditions (swapped and un-swapped) is visible as a rectangular signal, toggling between two signal levels. This rectangular signal is referred to as ripples 18. The ripples of the swapped Sine-signal 22 are indicated by numeral 28 and the ripples of the swapped Cosine-signal 23 are indicated by numeral 29. Furthermore, FIG. 5B shows the averages for the ripples 28 of the swapped Sine-signal 22 and the ripples 29 of the swapped Cosine-signal 23.

Figure 5C:
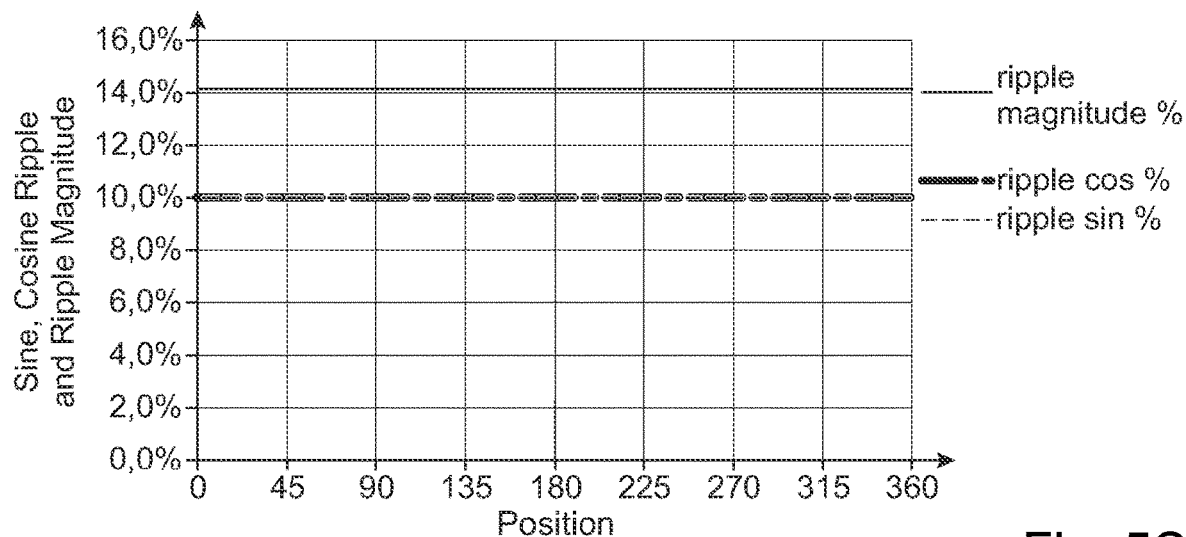
FIG. 5C illustrates a diagram showing the offset error of the signals of FIG. 5A over position and the magnitude of the offset error over position.

FIG. 5C shows the offset error for the Sine-signal 22 and Cosine-signal 23 of FIG. 5A and the magnitude both signals $$\left(\sqrt{(\text{Sin} - \text{signal } 22)^2 + (\text{Cosine} - \text{signal } 23)^2}\right)$$

over a full phase (0° to 360°). An indication of an offset error is that at any position the error of the Sine-signal 22 and Cosine-signal 23 is constant and equal.

Figure 5D:
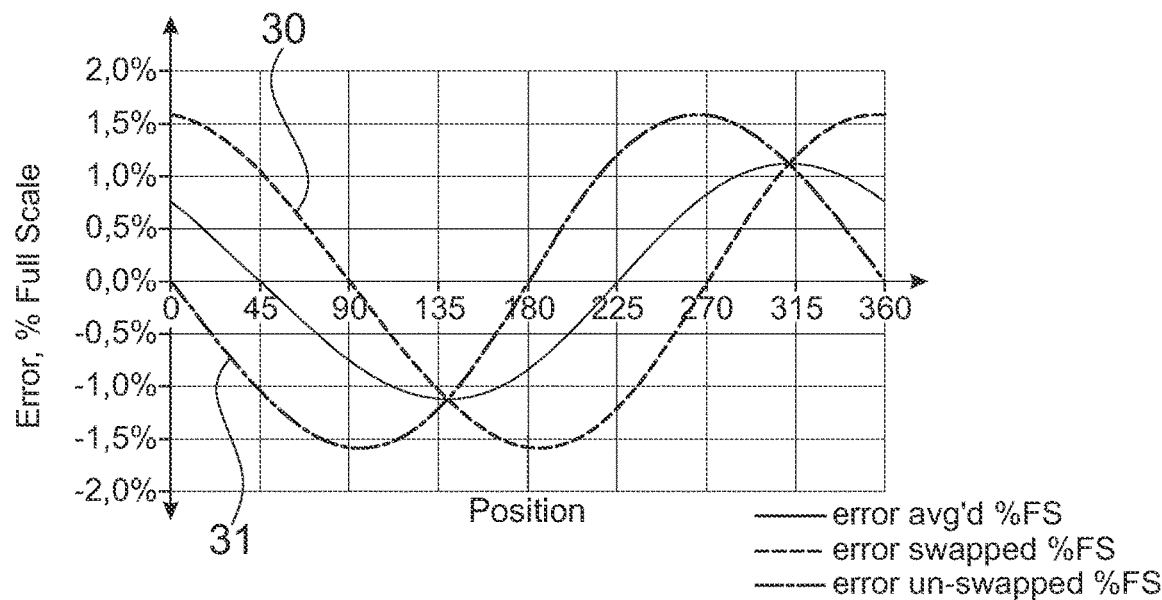
FIG. 5D illustrates a diagram showing the total error of the signals of FIG. 5A over position and the total average error.

FIG. 5D shows the total errors calculated from the un-swapped signal 31 and swapped signal 30 at the first system output 7 and the second system output 8 and the averaged total error. By averaging the errors of un-swapped signal 31 and swapped signal 30 the total offset error can be reduced.

Figure 6A:
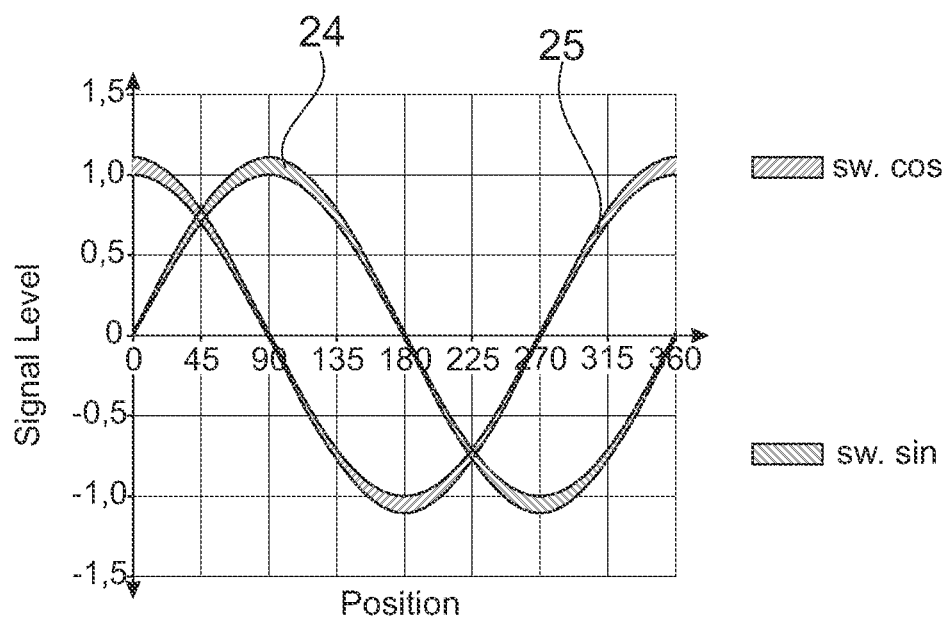
FIG. 6A illustrates a diagram showing output signals of a swapped position sensor system with an amplitude error.

FIG. 6A shows an error case where the second signal processing unit has a gain error of 10% relative to the maximum signal amplitude of 1.0. FIG. 6A shows the Sine-signal 24 and Cosine-signal 25 of the first system output 7 respectively the second system output 8 with the gain error over a full phase (0° to 360°).

Figure 6B:
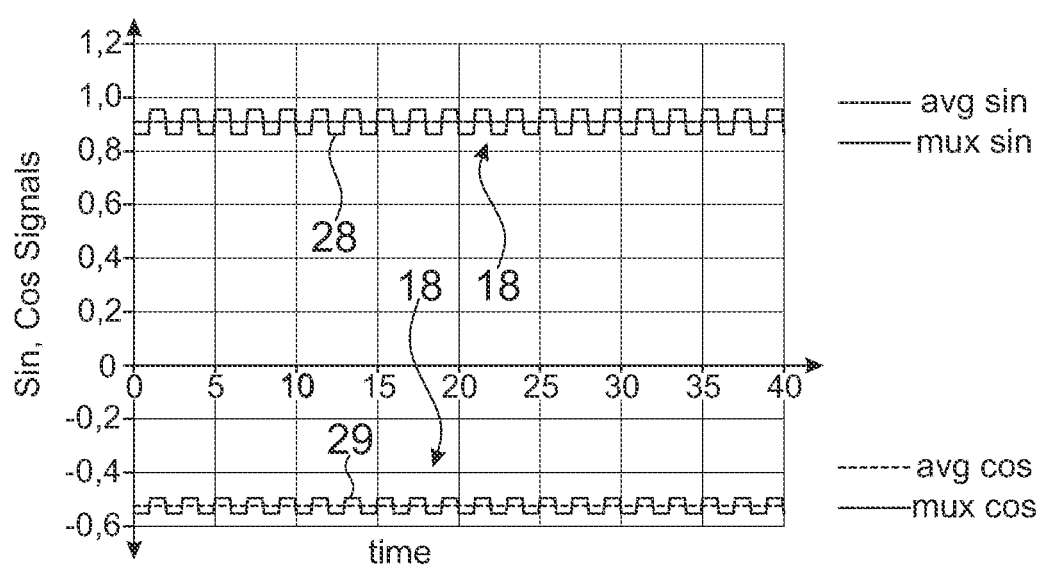
FIG. 6B illustrates a diagram showing an output of a static position sensor with the amplitude error of FIG. 6A over time.

FIG. 6B shows the output of a static sensor located at 120° of FIG. 6A in the time domain. The horizontal time axis is a relative number, representing 40 swapping cycles (20 swapping periods). The deviation between the signals of the two operating conditions (swapped and un-swapped) is visible as a rectangular signal, toggling between two signal levels. This rectangular signal is referred to as ripple 18. The ripples of the swapped Sine-signal 24 are indicated by numeral 28 and the ripples of the swapped Cosine-signal 25 are indicated by numeral 29. Furthermore, FIG. 6B shows the averages for the ripples 28 of the swapped Sine-signal 24 and the ripples 29 of the swapped Cosine-signal 25.

From FIG. 6A and FIG. 6B it follows that the largest ripple 18 occurs at the signal peaks and the smallest ripple 18 occurs at the zero crossings of each signal 28, 29.

Figure 6C:
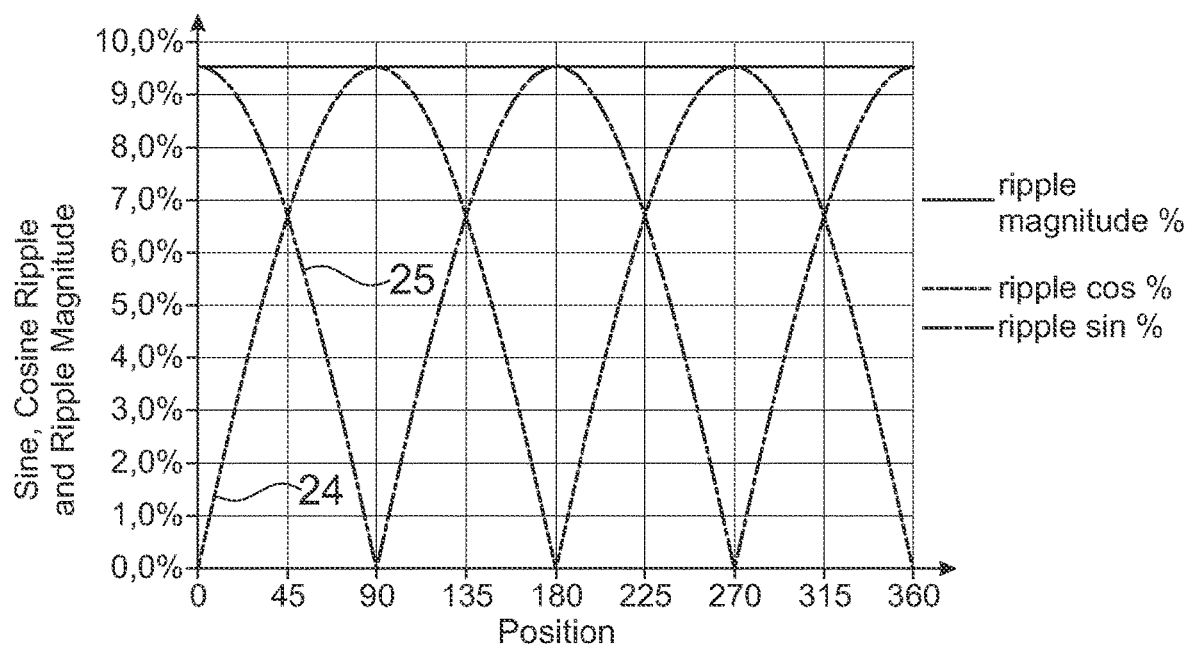
FIG. 6C illustrates a diagram showing the amplitude error of the signals of FIG. 6A over position and the magnitude of the amplitude error over position.

FIG. 6C shows the gain error for the Sine-signal 24 and Cosine-signal 25 of FIG. 6A and the magnitude both signals $$\left( \sqrt{(\text{Sin} - \text{signal } 24)^2 + (\text{Cosine} - \text{signal } 25)^2} \right)$$

over a full phase (0° to 360°). The largest error of the Sine-signal 24 respectively the Cosine-signal 25 occurs at the positive and negative peaks (90°, 270° for Sine-signal 24, 0°, 180° for Cosine-signal 25) and the minimum errors occurs at the zero crossings (0°, 180° for Sine-signal 24, 90°, 270° for Cosine-signal 25). An indication of a gain error is that the errors of the Sine-signal 24 and Cosine-signal 25 are not constant over a full phase, but the magnitude of both signals is constant.

Figure 6D:
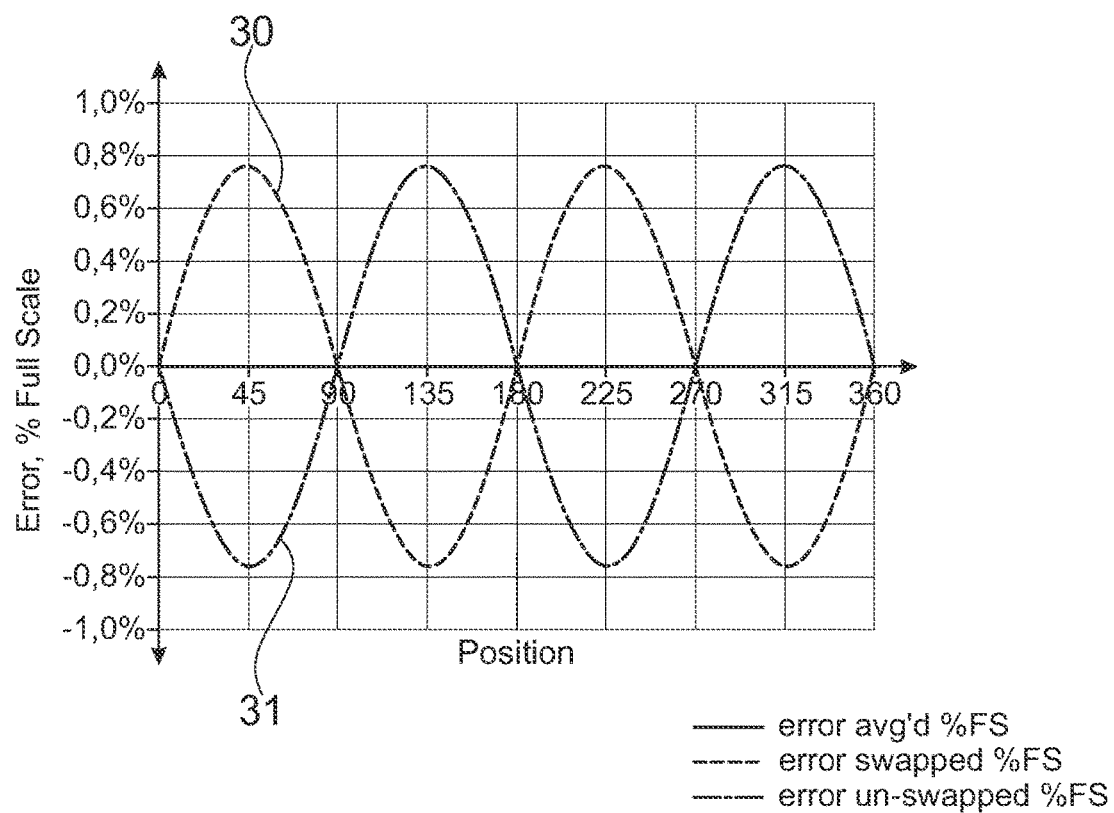
FIG. 6D illustrates a diagram showing the total error of the signals of FIG. 6A over position and the total average error over position.

FIG. 6D shows the total errors calculated from the un-swapped signal 31 and swapped signal 30 at the first system output 7 and the second system output 8 and the averaged total error. By averaging the errors of un-swapped signal 31 and swapped signal 30 the total amplitude error can be eliminated.

Figure 7A:
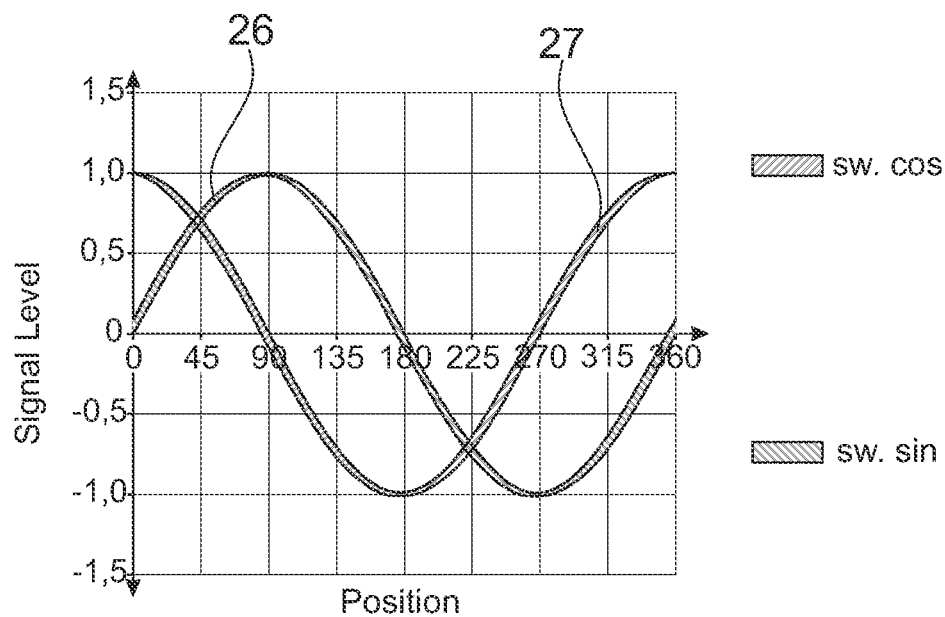
FIG. 7A illustrates a diagram showing output signals of a swapped position sensor system with a phase error.

FIG. 7A shows an error case where the second signal processing unit has a phase shift error of 6° compared to the first signal processing unit 7. FIG. 7A shows the Sine-signal 26 and Cosine-signal 27 of the first system output 7 respectively the second system output 8 having a phase shift error over a full phase (0° to 360°).

Figure 7B:
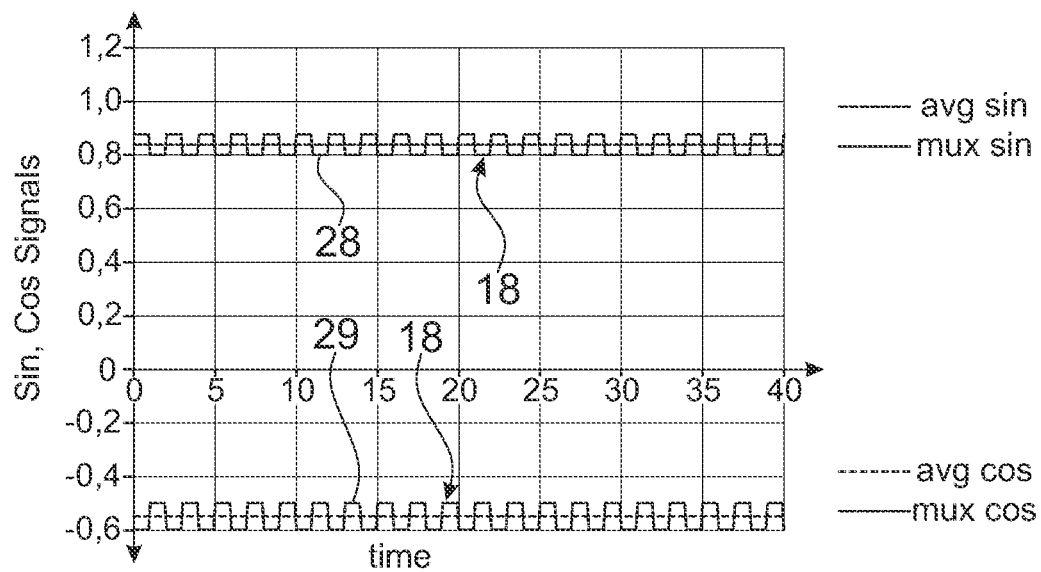
FIG. 7B illustrates a diagram showing an output of a static position sensor with the phase error of FIG. 7A over time.

FIG. 7B shows the output of a static sensor located at 120° of FIG. 7A in the time domain. The horizontal time axis is a relative number, representing 40 swapping cycles (20 swapping periods). The deviation between the signals of the two operating conditions (swapped and un-swapped) is visible as a rectangular signal, toggling between two signal levels. This rectangular signal is referred to as ripples 18. The ripples of the swapped Sine-signal 26 are indicated by numeral 28 and the ripples of the swapped Cosine-signal 27 are indicated by numeral 29. Furthermore, FIG. 7B shows the averages for the ripples 28 of the swapped Sine-signal 26 and the ripples 29 of the swapped Cosine-signal 27.

From FIG. 7A and FIG. 7B it follows that the largest ripple occurs at the zero crossings and the smallest ripple occurs at the signal peaks of each signal 26, 27.

Figure 7C:
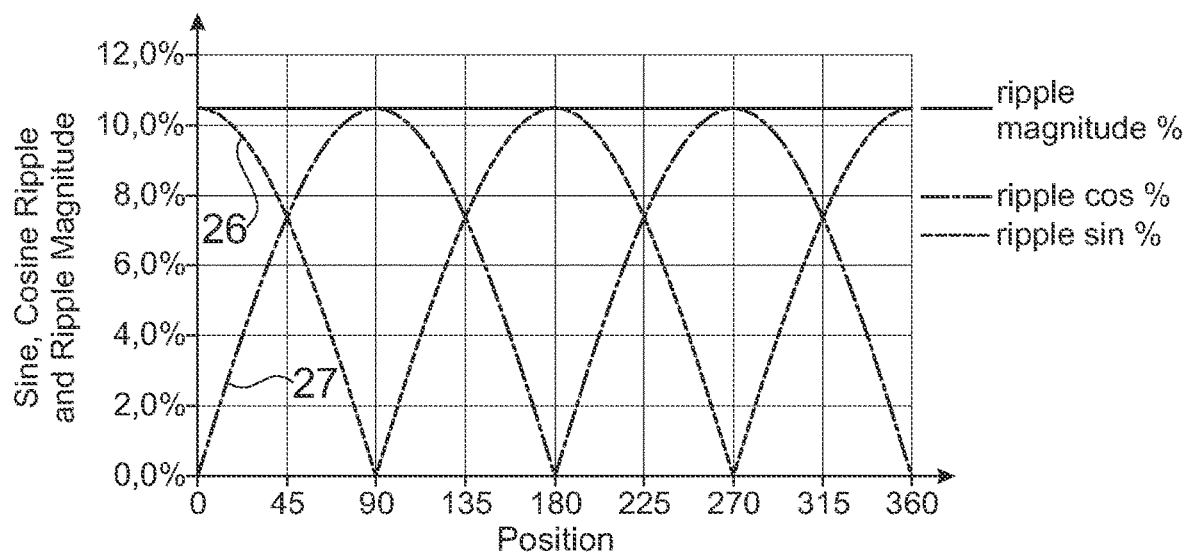
FIG. 7C illustrates a diagram showing the phase error of the signals of FIG. 7A over position and the magnitude of the phase error over position.

FIG. 7C shows the phase shift error for the Sine-signal 26 and Cosine-signal 27 of FIG. 7A and the magnitude both signals $$\left( \sqrt{(\text{Sin} - \text{signal } 26)^2 + (\text{Cosine} - \text{signal } 27)^2} \right)$$

over a full phase (0° to 360°). The largest error of the Sine-signal 26 respectively the cosine-signal 27 occurs at zero crossings (0°, 180° for Sine-signal 26, 90°, 270° for Cosine-signal 27) and the minimum errors occurs at the positive and negative peaks (90°, 270° for Sine-signal 26, 0°, 180° for Cosine-signal 27). An indication of a phase shift error is that the errors of the Sine-signal 26 and Cosine-signal 27 are not constant over a full phase, but the magnitude of both signals is constant.

Figure 7D:
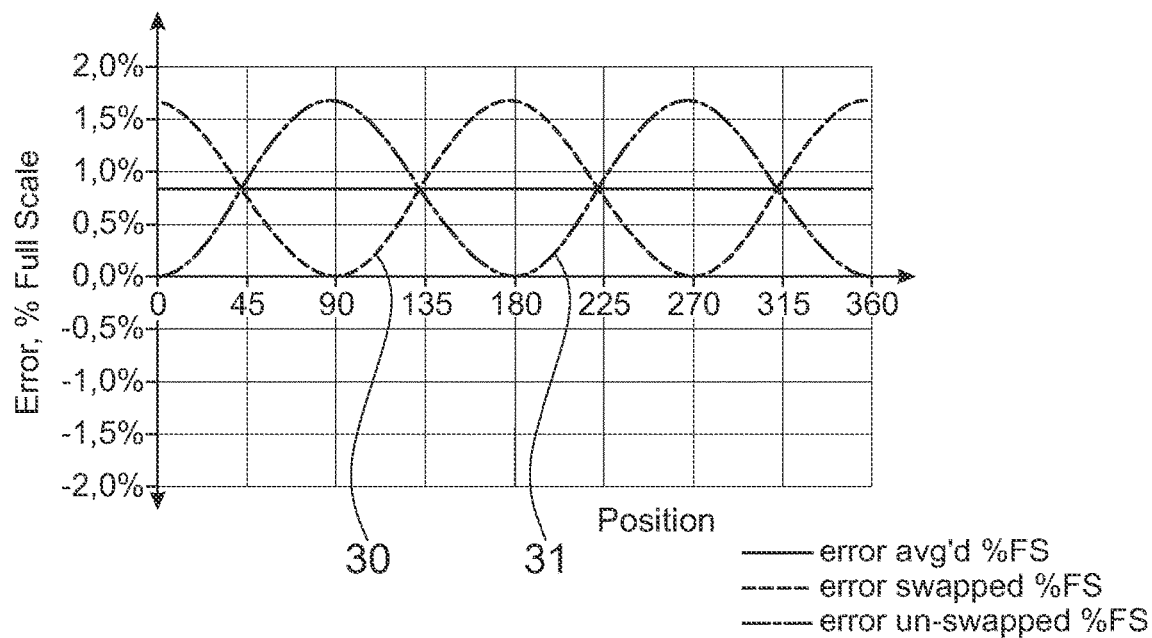
FIG. 7D illustrates a diagram showing the total error of the signals of FIG. 7A over position and the total average error over position.

FIG. 7D shows the total errors calculated from the un-swapped signal 31 and swapped signal 30 at the first system output 7 and the second system output 8 and the averaged total error. By averaging the errors of un-swapped signal 31 and swapped signal 30 the total phase shift error can be reduced to a constant level over a full phase.

Figure 8A:
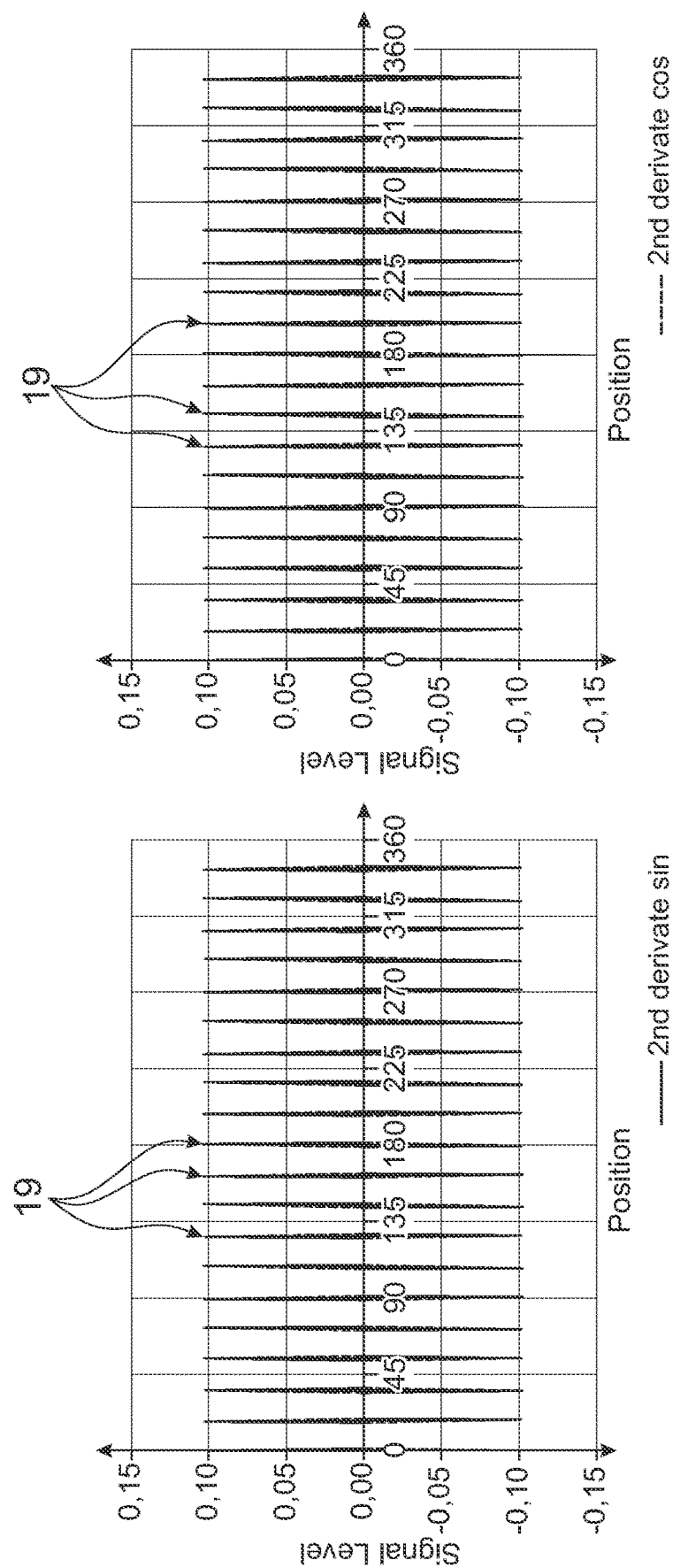
FIG. 8A illustrates a diagram showing the second derivate for output signals of a position sensor system with an offset error over position.
Figure 8B:
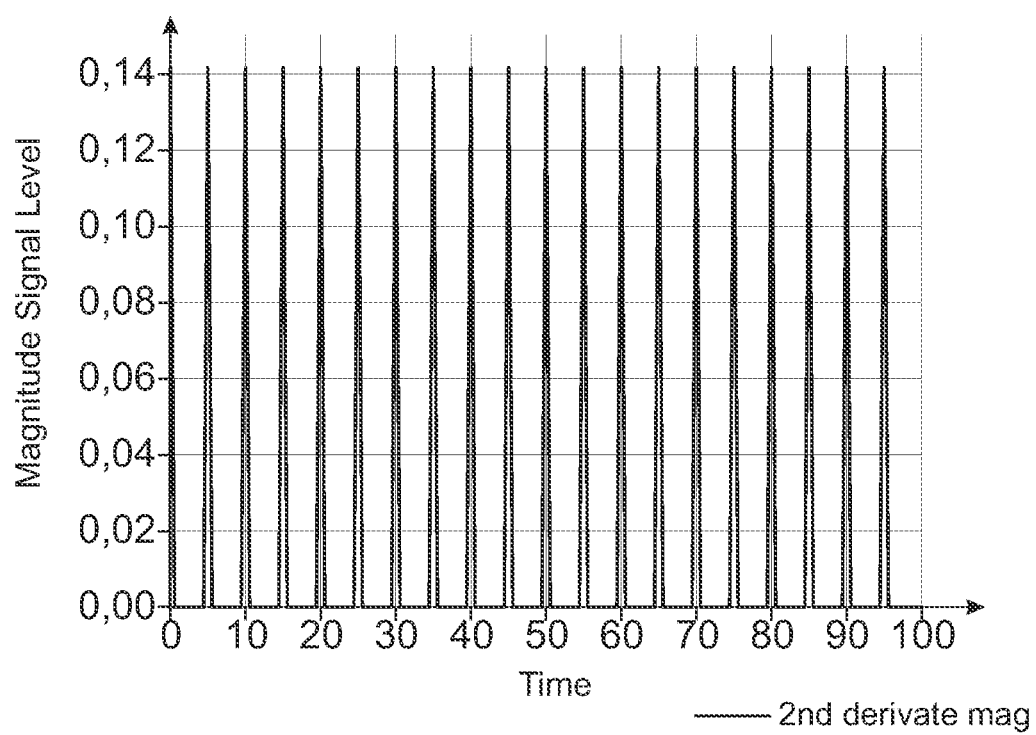
FIG. 8B illustrates a diagram showing the magnitude of the signals of FIG. 8A over time.

FIG. 8A shows the $2^{nd}$ derivate of the Sine-signal 22 and Cosine-signal 23 of FIG. 5A referring to the offset error. FIG. 8B shows the magnitude of the $2^{nd}$ derivates of FIG. 8A $$\left( \sqrt{f''(\text{Sine} - \text{Signal } 22)^2 + f''(\text{Cosine} - \text{Signal } 23)^2} \right).$$

FIG. 8A is split into two graphs due to the overlapping of the $2^{nd}$ derivate of the Sine-Signal 22 and the $2^{nd}$ derivate of the Cosine-Signal 23.

The vertical axis on both graphs is a relative number representing the $2^{nd}$ derivate of the signals. It depends on the time interval between measurements of the signal ripple 18 on the Sine-Signal 22 and Cosine-Signal 24, representing the sample rate of the analog-to-digital converter 13, 14, 17 analysing the Sine-signal 22 and Cosine-signal 23. The larger the error, the larger will be these signal levels. The horizontal axis of FIG. 8A represents the position of the position sensor 2 in electrical degrees and the horizontal axis of FIG. 8B is a relative number representing 20 swapping cycles (10 swapping periods).

An offset error in the first signal processing unit 5 and/or second signal processing unit 6 is indicated by a constant $2^{nd}$ derivate pulse over position. The $2^{nd}$ derivate magnitude is also constant over position.

Figure 9B:
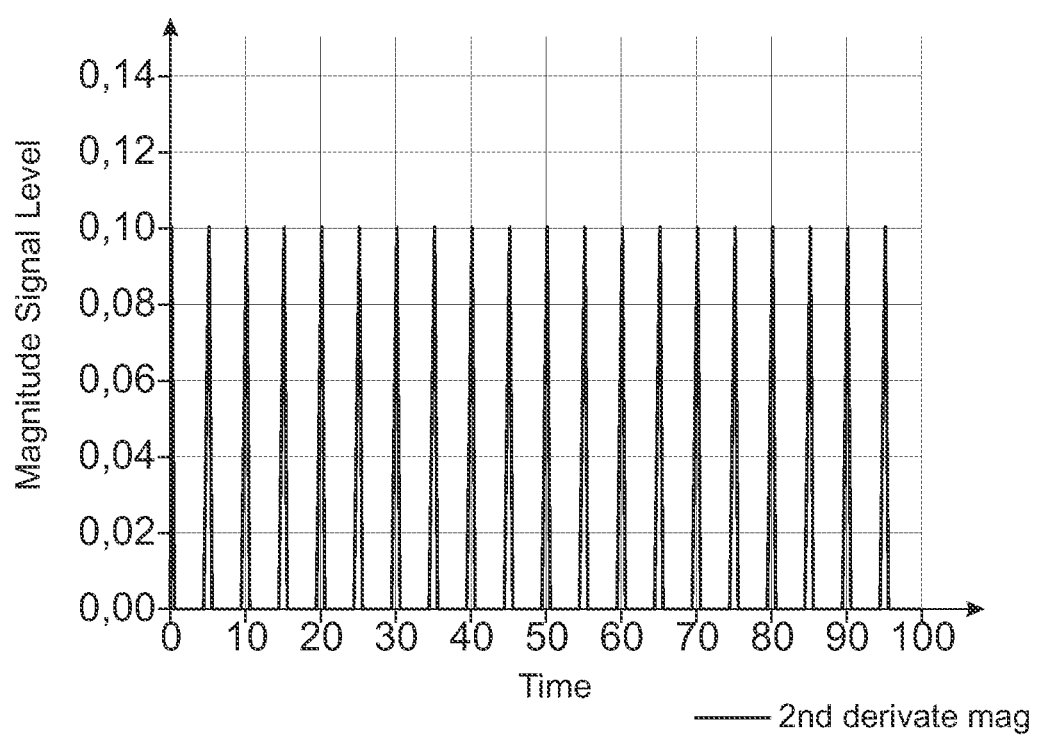
FIG. 9B illustrates a diagram showing the magnitude of the signals of FIG. 9A over time.

FIG. 9A shows the $2^{nd}$ derivate of the Sine-signal 24 and Cosine-signal 25 of FIG. 6A referring to the gain error. FIG. 9B shows the magnitude of the $2^{nd}$ derivates of FIG. 9A $$\left( \sqrt{f''(\text{Sine} - \text{Signal } 24)^2 + f''(\text{Cosine} - \text{Signal } 25)^2} \right).$$

FIG. 9A is split into two graphs due to the partial overlapping of the $2^{nd}$ derivate of the Sine-Signal 24 and the $2^{nd}$ derivate of the Cosine-Signal 25.

The diagrams of FIGS. 9A and 9*b* otherwise correspond to FIGS. 8A and 8*b*, especially with respect to the axis.

A gain error in the first signal processing unit 5 and/or second signal processing unit 6 is indicated by a non-constant $2^{nd}$ derivate peak pulse pattern over position. The $2^{nd}$ derivate magnitude is constant over position and time.

Figure 10B:
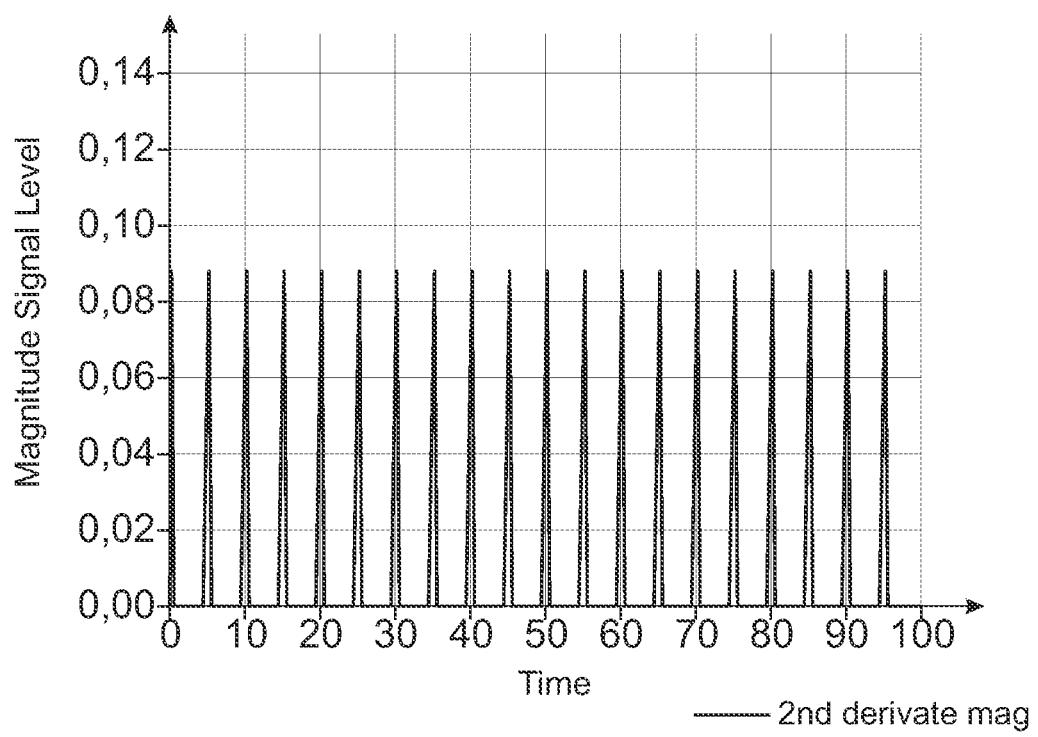
FIG. 10B illustrates a diagram showing the magnitude of the signals of FIG. 10A over time.

FIG. 10A shows the $2^{nd}$ derivate of the Sine-signal 26 and Cosine-signal 27 of FIG. 7A referring to the phase shift error. FIG. 10B shows the magnitude of the $2^{nd}$ derivates of FIG. 10A $$\left( \sqrt{f''(\text{Sine} - \text{Signal } 26)^2 + f''(\text{Cosine} - \text{Signal } 27)^2} \right).$$

FIG. 10A is split into two graphs due to the partial overlapping of the $2^{nd}$ derivate of the Sine-Signal 22 and the $2^{nd}$ derivate of the Cosine-Signal 23.

The diagrams of FIGS. 10A and 10b otherwise correspond to FIGS. 8A and 8b, especially with respect to the axis.

A phase shift error in the first signal processing unit 5 and/or second signal processing unit 6 is indicated by a non-constant $2^{nd}$ derivate peak pulse pattern over position. The $2^{nd}$ derivate magnitude is constant over position and time.

Figure 11:
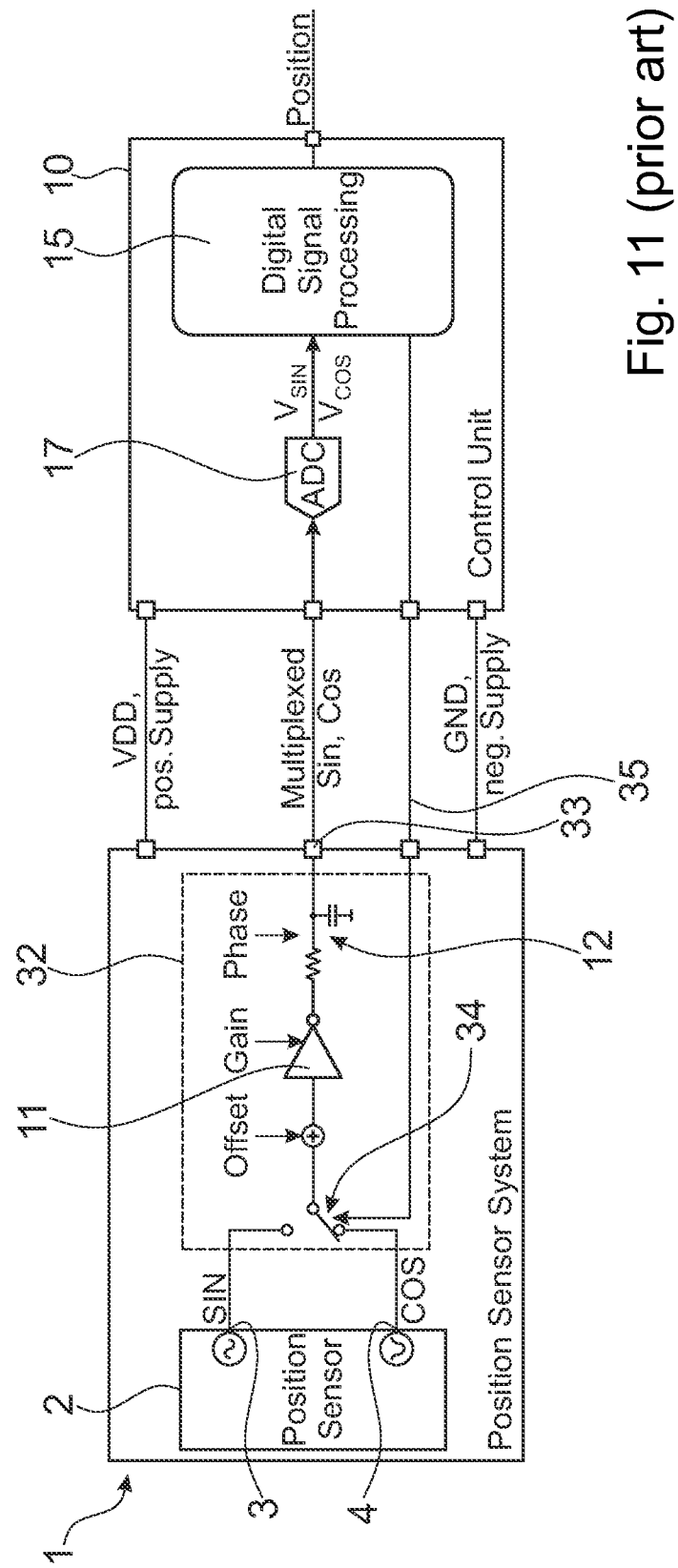
FIG. 11 illustrates a block diagram of a position sensor system according to the prior art.

FIG. 11 shows a block diagram of a position sensor system 1 according to the prior art. The position sensor system 1 comprises a position sensor 2 with a first sensor output 3 and a second sensor output 4. The position sensor system 1 further comprises a signal processing unit 32 for processing, particularly amplifying and filtering, the signal of the first sensor output 3 and the second sensor output 4.

The signal processing unit 32 comprises a multiplexer 34 to multiplex between the first sensor output 3 and the second sensor output 4. The signal processing unit 32 further comprises an amplifier 11 and a filter 12.

The position sensor system 1 comprises a system output 33 providing the output of the signal processing unit 32.

The position sensor system 1 of FIG. 11 further comprises a control unit 10. The control unit 10 can be either integral with the position sensor system 1, i.e. on the same chip, or external of the position sensor system 1 and connected to the position sensor system 1 by e.g. a cable. FIG. 11 refers to an external control unit 10, as indicated by the connection points and lines between the position sensor system 1 and the control unit 10.

The control unit 10 in FIG. 11 comprises an analog-to-digital converter 17 for the system output 33. The output of the analog-to-digital converter 17 is processed by digital signal processing unit 15.

The control unit 10, especially the digital signal processing unit 15 must have knowledge which sensor output 3, 4 is currently processed by the signal processing unit 32. Therefore, the control unit 10, especially the digital signal processing unit 15 controls the multiplexer 34 of the signal processing unit 32 via a control line 35. This requires additional wiring between the position sensor system 1 and the external control unit 10. A further disadvantage of this variant is that in a rotating position sensor system 1, due to the sequential processing of both signals, both position sensor signals are not measured at the same position as the item to be measured will have moved by a certain amount between the measurements of the two position sensor signals, which is particularly disadvantageous for high speed systems, as this error increases with rotating speed.

What is claimed is:

1. A rotational position sensor system, comprising:
a position sensor, configured to detect rotational movement and provide a first sensor signal on a first sensor output and a second sensor signal on a second sensor output, each of the first sensor signal and the second sensor signal related to the rotational movement, the first sensor signal and the second sensor signal having a phase difference;
a first signal processing unit having a filter and an amplifier, the first signal processing unit receiving one of the first sensor output signal or the second sensor signal and providing a first processing signal;
a second signal processing unit having a filter and an amplifier, the second signal processing unit receiving, particularly amplifying and filtering, the signal of the second sensor output signal or the first sensor output opposite that of the first signal processing unit, the second signal processing unit providing a second processing signal;
a first system output coupled to provide the output first processing signal of the first signal processing unit or the second processing signal of the second signal processing unit; and
a second system output coupled to provide the output second processing signal of the second signal processing unit or the first processing signal of the first signal processing unit, opposite that of the first system output; and
the position sensor system further comprises a control unit for processing the first system output and the second system output, which determines the second derivate of the first system output and of the second system output and detects peaks in the calculated second derivates representing errors in the first signal processing unit respectively in the second signal processing unit;
a swapping unit coupled between the position sensor and the first signal processing unit and the second signal processing unit and coupled between the first signal processing unit and the second signal processing unit and the first system output and the second system output, wherein the position sensor system further to swap between a first operating condition and a second operating condition via the swapping unit,
wherein in the first operating condition the swapping unit provides the first sensor signal to the first signal processing unit, the second sensor signal to the second processing unit, the first processing signal to the first system output, and the second processing signal to the second system output, and
wherein in the second operating condition the sapping unit provides the first sensor signal to the second signal processing unit, the second sensor signal to the first processing unit, the first processing signal to the second system output, and the second processing signal to the first system output.

2. The position sensor system according to claim 1, further comprising a control unit for processing the first system output and the second system output.

3. The position sensor system according to claim 2, wherein the control unit comprises a first analog-to-digital converter for the first system output, a second analog-to-digital converter for the second system output, and a digital signal processing unit for processing the signals of the first analog-to-digital converter and the second analog-to-digital converter.

4. The position sensor system according to claim 2, wherein the control unit comprises a multiplexer for multiplexing between the first system output and the second system output and a common analog-to-digital converter connected to the output of the multiplexer, and a digital signal processing unit for processing the signal of the common analog-to-digital converter.

5. The position sensor system according to claim 2, wherein the control unit detects ripples in the first system output and/or second system output caused by swapping the first signal processing unit and the second signal processing unit.

6. The position sensor system according to claim 2, wherein the control unit further determines magnitude for the ripples in the first system output and second system output.

7. The position sensor system according to claim 2, wherein the control unit determines the second derivate of the first system output and of the second system output and detects peaks in the calculated second derivates representing errors in the first signal processing unit respectively in the second signal processing unit.

8. The position sensor system according to claim 7, wherein the control unit calculates the average of the first system output respectively of the second system output.

9. A method for detecting errors in a rotation position sensor system, particularly for detecting rotary movement, comprising:
   configuring to detect rotational movement and provide a first sensor signal on a first sensor output and a second sensor signal on a second sensor output, each of the first sensor signal and the second sensor signal related to the rotational movement, the first sensor signal and the second sensor signal having a phase difference;
   filtering and an amplifier, the first signal processing unit receiving one of the first sensor output signal or the second sensor signal and providing a first processing signal;
   amplifying and filtering, the signal of the second sensor output signal or the first sensor output opposite that of the first signal processing unit, the second signal processing unit providing a second processing signal;
   providing the output first processing signal of the first signal processing unit or the second processing signal of the second signal processing unit; and
   providing the output second processing signal of the second signal processing unit or the first processing signal of the first signal processing unit, opposite that of the first system output; and processing by controller the first system output and the second system output, which determines the second derivate of the first system output and of the second system output and detects peaks in the calculated second derivates representing errors in the first signal processing unit respectively in the second signal processing unit;
   swapping the first signal processing unit from the first sensor output and first system output to the second sensor output and second system output and for simultaneously swapping the second signal processing unit from the second sensor output and second system output to the first sensor output and first system output; and
   alternately switching between a first operating condition and a second operating condition, wherein the first operating condition includes processing, a first sensor output processed in a first signal processing unit and providing the result to a first system output and processing a second sensor output signal in a second signal processing unit and providing the result to a second system output, the first sensor output signal and the second sensor output signal differing by a phase difference; and
   wherein the second operating condition, includes processing the first sensor output in the second signal processing unit and providing the result to the first system output and in which processing the second sensor output in the first signal processing unit and provided providing the result to the second system output.

10. The method according to claim 9, further including processing the first system output and the second system output in a control unit.

11. The method according to claim 10, wherein processing by the control unit includes converting the first system output in a first analog-to-digital converter and converting the second system output in a second analog-to-digital converter of the control unit or multiplexing between the first system output and the second system output and converting the multiplexed signal in a common analog-to-digital converter.

12. The method according to claim 9, comprising the step of detecting ripples in the first system output and/or second system output caused by alternating between the first operating condition and the second operating condition, preferably over time for a static position sensor and/or over the position of the sensor.

13. The method according to claim 12, comprising the step of determining the magnitude for the ripples in the first system output and second system output.

14. The method according to claim 9, comprising the step of calculating the second derivate of the first system output and of the second system output and detecting peaks in the calculated second derivates representing errors in the first signal processing unit respectively in the second signal processing unit.

15. The method according to claim 9, comprising the step of determining the average of the first system.

* * * * *